United States Patent
Badillo et al.

(10) Patent No.: US 8,395,456 B2
(45) Date of Patent: Mar. 12, 2013

(54) VARIABLE PHASE AMPLIFIER CIRCUIT AND METHOD OF USE

(75) Inventors: Dean A. Badillo, Chandler, AZ (US); Reimund Rebel, Maricopa, AZ (US); Klaus Juergen Schoepf, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 47 days.

(21) Appl. No.: 13/049,738

(22) Filed: Mar. 16, 2011

(65) Prior Publication Data
US 2011/0163819 A1 Jul. 7, 2011

Related U.S. Application Data

(63) Continuation-in-part of application No. 12/699,094, filed on Feb. 3, 2010, and a continuation-in-part of application No. 12/699,095, filed on Feb. 3, 2010.

(60) Provisional application No. 61/149,815, filed on Feb. 4, 2009, provisional application No. 61/184,138, filed on Jun. 4, 2009.

(51) Int. Cl.
*H03B 5/30* (2006.01)

(52) U.S. Cl. ............... 331/116 R; 331/107 A; 331/135

(58) Field of Classification Search .......... 331/116 R, 331/116 FE, 116 M, 154, 155, 156, 158, 331/135, 107 A, 177 R
See application file for complete search history.

(56) References Cited

U.S. PATENT DOCUMENTS

| | | | |
|---|---|---|---|
| 5,416,447 A | 5/1995 | Andres et al. | |
| 5,914,553 A | 6/1999 | Adams et al. | |
| 5,939,956 A | 8/1999 | Arimura et al. | |
| 6,124,765 A | 9/2000 | Chan et al. | |
| 6,577,040 B2 | 6/2003 | Nguyen | |
| 6,739,190 B2 | 5/2004 | Hsu et al. | |
| 6,828,713 B2 | 12/2004 | Bradley et al. | |
| 6,831,531 B1 | 12/2004 | Giousouf et al. | |
| 6,859,113 B2 | 2/2005 | Giousouf et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,995,622 B2 | 2/2006 | Partridge et al. | |

(Continued)

FOREIGN PATENT DOCUMENTS

| EP | 0375360 A2 | 6/1990 |
|---|---|---|
| EP | 1505722 A2 | 2/2005 |

(Continued)

OTHER PUBLICATIONS

Driscoll, M.M., "Linear Frequency Tuning of Saw Resonators," IEEE Trans. on Ultrasonics, Ferroelectrics and Frequency Control:38(4):366-369 (1991).

(Continued)

*Primary Examiner* — Ryan Johnson
(74) *Attorney, Agent, or Firm* — Schmeiser, Olsen & Watts, LLP

(57) ABSTRACT

A variable phase amplifier circuit is disclosed and its method of use in tuning devices having resonators. The variable phase amplifier receives an input differential signal pair. The input differential signal pair can be generated by a resonator device. The variable phase amplifier generates a modified differential signal pair in response to receiving the input differential signal pair. The variable phase amplifier provides a means to vary the phase of the modified differential signal pair with respect to the input differential signal pair, in an accurate and stable manner. If the modified differential signal pair with a phase shift introduced in it is fed back to the resonator device, the resonator will change its frequency of oscillation, where the new frequency of oscillation is a function of the phase of the modified differential signal pair.

22 Claims, 18 Drawing Sheets

U.S. PATENT DOCUMENTS

| | | | |
|---|---|---|---|
| 7,005,946 | B2 | 2/2006 | Duwel et al. |
| 7,211,926 | B2 | 5/2007 | Quevy et al. |
| 7,215,061 | B2 | 5/2007 | Kihara et al. |
| 7,248,128 | B2 | 7/2007 | Mattila et al. |
| 7,352,608 | B2 | 4/2008 | Mohanty et al. |
| 7,492,241 | B2 | 2/2009 | Piazza et al. |
| 7,504,909 | B2 | 3/2009 | Tada |
| 7,724,103 | B2 | 5/2010 | Feng et al. |
| 7,791,432 | B2 | 9/2010 | Piazza et al. |
| 2002/0075100 | A1 | 6/2002 | Katohno |
| 2002/0158700 | A1 | 10/2002 | Nemoto |
| 2003/0034852 | A1 | 2/2003 | Kobayashi et al. |
| 2004/0056728 | A1 | 3/2004 | Dent et al. |
| 2005/0073078 | A1 | 4/2005 | Lutz et al. |
| 2008/0048804 | A1 | 2/2008 | Volatier et al. |
| 2008/0143217 | A1 | 6/2008 | Ho et al. |
| 2008/0204153 | A1 | 8/2008 | Yoshida et al. |
| 2008/0272852 | A1 | 11/2008 | Six |
| 2009/0026882 | A1 | 1/2009 | Steeneken et al. |
| 2009/0108381 | A1 | 4/2009 | Buchwalter et al. |
| 2009/0108959 | A1 | 4/2009 | Piazza et al. |
| 2009/0144963 | A1 | 6/2009 | Piazza et al. |
| 2009/0243747 | A1 | 10/2009 | Gaidarzhy et al. |
| 2009/0294638 | A1 | 12/2009 | Mohanty et al. |
| 2010/0007443 | A1 | 1/2010 | Mohanty et al. |
| 2010/0134207 | A1 | 6/2010 | Mohanty et al. |
| 2010/0155883 | A1 | 6/2010 | Wenzler et al. |
| 2010/0181868 | A1 | 7/2010 | Gaidarzhy et al. |
| 2010/0315170 | A1 | 12/2010 | Locascio |
| 2011/0298549 | A1* | 12/2011 | Luong et al. .................... 331/57 |

FOREIGN PATENT DOCUMENTS

| | | | |
|---|---|---|---|
| WO | 98/01948 | A1 | 1/1998 |
| WO | 98/37635 | A1 | 8/1998 |
| WO | 02/17481 | A2 | 2/2002 |
| WO | 2005/029700 | A1 | 3/2005 |
| WO | 2006/000611 | A1 | 1/2006 |
| WO | 2006/083482 | A2 | 8/2006 |
| WO | 2010/011288 | A1 | 1/2010 |

OTHER PUBLICATIONS

Driscoll et al., "Voltage-Controlled Crystal Oscillators," IEEE Trans. on Electron Devices:ED18(8):528-535 (1971).

Humad et al., "High Frequency Micromechanical Piezo-on-Silicon Block Resonators," Int'l Electron Devices Meeting 2003 IEDM, Technical Digest, Washington, D.C. Dec. 8-10, 2003, New York, NY:IEEE US Dec. 8, 2003, pp. 957-960.

International Search Report and Written Opinion for International Application No. PCT/US2010/000301 mailed Sep. 3, 2010.

International Search Report and Written Opinion for International Application No. PCT/US2009/006587 mailed Feb. 26, 2010.

International Search Report and International Preliminary Report on Patentability for PCT/US2006/021298 mailed Nov. 6, 2006 and Dec. 6, 2007 respectively.

Piazza et al., "Low Motional Resistance Ring-Shaped Contour-Mode Aluminum Nitride Piezoelectric Micromechanical Resonators for UHF Applications," Micro Electro Mechanical Systems, 2005. MEMS 2005. 18th IEEE International Conference in Miami Beach, Florida, Jan. 30-Feb. 3, 2005, Piscataway, New Jersey, US, IEEE Jan. 30, 2005, pp. 20-23.

Tirole, et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

* cited by examiner

VARIABLE PHASE AMPLIFIER CIRCUIT AND METHOD OF USE

CROSS REFERENCE TO RELATED APPLICATIONS

This application claims the benefit under 35 U.S.C. §120 as a continuation-in-part of U.S. Utility patent application to Reimund Rebel, et al, entitled "Methods and Apparatus for Tuning Devices Having Mechanical Resonators", Ser. No. 12/699,094, filed Feb. 3, 2010, which claims priority to U.S. Provisional Patent Application to Klaus Juergen Schoepf et al, entitled "Methods and Apparatus for Tuning Oscillators," Ser. No. 61/149,815 filed Feb. 4, 2009, the disclosures of which are hereby incorporated entirely herein by reference. U.S. Utility patent application Ser. No. 12/699,094 also claims priority to U.S. Provisional Patent Application to Reimund Rebel et al, entitled "Methods and Apparatus for Tuning Devices Having Mechanical Resonators," Ser. No. 61/184,138 filed Jun. 4, 2009, the disclosure of which is hereby incorporated entirely herein by reference. This application also claims the benefit under 35 U.S.C. §120 as a continuation-in-part of U.S. Utility patent application to Reimund Rebel, et al, entitled "Methods and Apparatus for Tuning Devices Having Mechanical Resonators", Ser. No. 12/699,095, filed Feb. 3, 2010, which claims priority to U.S. Provisional Patent Application to Klaus Juergen Schoepf et al, entitled "Methods and Apparatus for Tuning Oscillators," Ser. No. 61/149,815 filed Feb. 4, 2009, the disclosures of which are hereby incorporated entirely herein by reference. U.S. Utility patent application Ser. No. 12/699,095 also claims priority to U.S. Provisional Patent Application to Reimund Rebel et al, entitled "Methods and Apparatus for Tuning Devices Having Mechanical Resonators," Ser. No. 61/184,138 filed Jun. 4, 2009, the disclosure of which is hereby incorporated entirely herein by reference.

BACKGROUND OF THE INVENTION

1. Technical Field

This invention relates generally to phase shifting circuits and in particular to a variable phase amplifier circuit and its use in tuning devices having resonators.

2. State of the Art

Some electromechanical oscillators include a mechanical resonator coupled to an electronic driving circuit. The electronic driving circuit produces a drive signal to drive the mechanical resonator. The mechanical resonator has an inherent resonance frequency. The inherent resonance frequency of the mechanical resonator is determined, at least partially, by factors that are subject to design choice such as size, shape, and resonator material. The mechanical resonator may be designed to have a desired resonance frequency by suitably designing those factors. However, due to manufacturing tolerances resulting in deviations of the design factors from their intended values, and due to variations arising during operation of the electromechanical oscillator (for example, temperature induced variations, ambient pressure variations, package-induced stress, material dependent stress), the mechanical resonator may not have the desired inherent resonance frequency in all situations.

To account for manufacturing tolerances and temperature induced shifts in the resonance frequency of the mechanical resonator, the electromechanical oscillator may be tuned. FIG. 1 illustrates a characteristic impedance curve of a resonator as a function of frequency, which curve is applicable to the mechanical resonators of typical electromechanical oscillators. The impedance is illustrated by line 102, and includes both a series resonance peak 104, occurring at a resonance frequency $f_{res}$, and a parallel resonance peak 106. In the case of electromechanical oscillators having a mechanical resonator, conventional tuning methods allow for tuning of the oscillator operation within a tuning range 108 between the series resonance peak and the parallel resonance peak. Because the conventional tuning range 108 occurs on only one side of the series resonance frequency, $f_{res}$, the accuracy of tuning of the oscillator around the series resonance frequency of the mechanical resonator is limited. Accordingly, it is desirable to have a device which is capable of tuning a mechanical resonator in a tuning range that extends above and below the series resonance peak of the mechanical resonator.

DISCLOSURE OF THE INVENTION

The present invention relates to a variable phase amplifier circuit and its use in tuning a device having a mechanical resonator. A variable phase amplifier circuit is disclosed which accepts an input differential signal pair and generates a modified differential signal pair, where the modified differential signal pair can have a phase that is different than the phase of the input differential signal pair. The variable phase amplifier circuit provides a means to adjust the phase of the modified differential signal pair with respect to the input differential signal pair. In some embodiments the variable phase amplifier receives the input differential signal pair from a resonator. In some embodiments the modified differential signal pair is fed back to the resonator. The oscillating frequency of the resonator can be a function of the phase of the modified differential signal pair, such that the oscillating frequency of the resonator can be adjusted, or tuned, by adjusting the phase of the modified differential signal pair with respect to the phase of the input differential signal pair.

A device is disclosed that includes a mechanical resonator and a variable phase amplifier circuit. The variable phase amplifier circuit receives an input signal from the mechanical resonator, wherein the input signal has a phase. The variable phase amplifier circuit includes a phase splitter circuit that generates a first and a second differential signal pair in response to receiving the input differential signal pair. The variable phase amplifier also includes a first variable gain amplifier circuit. The first variable gain amplifier circuit scales the first differential signal pair that is received from the phase splitter circuit by a first scale factor. The variable phase amplifier circuit also includes a second variable gain amplifier circuit. The second variable gain amplifier circuit scales the second differential signal pair that is received from the phase splitter circuit by a second scale factor. The variable phase amplifier circuit also includes a summation circuit. The summation circuit generates a modified differential signal pair in response to receiving a first scaled differential signal pair from the first variable gain amplifier circuit and a second scaled differential signal pair from the second variable gain amplifier circuit. The modified differential signal pair has a phase that is a function of the first scale factor. The modified differential signal pair is received by the mechanical resonator, and the oscillating frequency of the mechanical resonator is a function of the phase of the modified differential signal pair. In some embodiments the oscillating frequency of the mechanical resonator is adjusted in response to adjusting the first scale factor. In some embodiments the phase of the modified differential signal pair is adjusted in response to adjusting the first scale factor. In some embodiments the summation circuit sums a first end of the first scaled differential signal pair to a first end of the second scaled differential signal pair. In some embodiments the summation circuit sums a second end of the first scaled differential signal pair to a second end of the second scaled differential signal pair.

A variable phase amplifier circuit is disclosed. The variable phase amplifier circuit comprises a phase splitter circuit. The phase splitter circuit generates a first and a second differential signal pair in response to receiving an input differential signal pair, wherein the second differential signal pair has a phase that is different from a phase of the first differential signal pair. The variable gain amplifier circuit also includes a first variable gain amplifier circuit that scales the first differential signal pair by a first scale factor in response to receiving the first differential signal pair. The variable gain amplifier circuit also includes a second variable gain amplifier circuit that scales the second differential signal pair by a second scale factor in response to receiving the second differential signal pair. The variable phase amplifier circuit also includes a summation circuit coupled to the first and the second variable gain amplifier circuits. The summation circuit outputs a modified differential signal pair in response to receiving a first scaled differential signal pair from the first variable gain amplifier circuit and a second scaled differential signal pair from the second variable gain amplifier circuit. In some embodiments the phase of the first differential signal pair is the same as a phase of the input differential signal pair. In some embodiments the first differential signal pair is the input differential signal pair. In some embodiments a phase of the modified differential signal pair is a function of the first scale factor. In some embodiments a phase of the modified differential signal pair is a function of the second scale factor. In some embodiments the phase of the second differential signal pair is shifted 90 degrees with respect to the phase of the first differential signal pair. In some embodiments a phase of a second end of the first differential signal pair is shifted 180 degrees with respect to a phase of a first end of the first differential signal pair. In some embodiments a phase of a second end of a second differential signal pair is shifted 180 degrees with respect to a phase of a first end of the second differential signal pair. In some embodiments the first scale factor is different than the second scale factor. In some embodiments the phase of the modified differential signal pair is a function of the first and the second scale factor. In some embodiments the summation circuit sums a first end of the first scaled differential signal pair to a first end of the second scaled differential signal pair. In some embodiment the summation circuit sums a second end of the first scaled differential signal pair to a second end of the second scaled differential signal pair.

A method of adjusting a phase of a differential signal pair is disclosed that includes the steps of generating a second differential signal pair from a first differential signal pair and generating a first scaled differential signal pair by scaling the first differential signal pair by a first scale factor. The method also includes the steps of generating a second scaled differential signal pair by scaling the second differential signal pair by a second scale factor, and generating a modified differential signal pair by summing the first and the second scaled differential signal pairs. The method also includes the step of adjusting the second scale factor, where a phase of the modified differential signal pair is adjusted in response to adjusting the second scale factor. In some embodiments generating a second differential signal pair from a first differential signal pair comprises phase splitting the second differential signal pair from the first differential signal pair. In some embodiments a phase of the second differential signal pair is shifted 90 degrees with respect to a phase of the first differential signal pair. In some embodiments a phase of a second end of the first differential signal pair is shifted 180 degrees with respect to a phase of a first end of the first differential signal pair. In some embodiments the method includes adjusting the first scale factor, wherein the phase of the modified differential signal pair is adjusted in response to adjusting the first scale factor. In some embodiments a phase of a second end of the second differential signal pair is shifted 180 degrees with respect to a first end of the second differential signal pair. In some embodiments generating a modified differential signal pair includes summing together a first end of the first scaled differential signal pair and a first end of the second scaled differential signal pair, and summing together a second end of the first scaled differential signal pair and a second end of the second scaled differential signal pair.

A method of adjusting the frequency of oscillation of a mechanical resonator is disclosed which includes the steps of generating a first and a second differential signal pair in response to receiving an input differential signal pair from a mechanical resonator, and generating a first scaled differential signal pair by scaling the first differential signal pair by a first scale factor. The method also includes generating a second scaled differential signal pair by scaling the second differential signal pair by a second scaled factor, and summing together a first end of the first scaled differential signal pair and a first end of the second scaled differential signal pair to create a first end of a summed differential signal pair. The method of adjusting the frequency of oscillation of a mechanical resonator according to the invention also includes summing together a second end of the first scaled differential signal pair and a second end of the second scaled differential signal pair to create a second end of the summed differential signal pair, and generating a modified differential signal pair by phase shifting the first end and the second end of the summed differential signal pair by a fixed number of degrees. The method also includes providing the modified differential signal pair as input to the mechanical resonator, where the frequency of oscillation of the mechanical resonator is a function of the difference between a phase of the modified differential signal pair and a phase of the input differential signal pair. In some embodiments the method of adjusting the frequency of oscillation of a mechanical resonator includes the step of adjusting the first scale factor, where the frequency of oscillation of the mechanical resonator is adjusted in response to adjusting the first scale factor. In some embodiments the method of adjusting the frequency of oscillation of a mechanical resonator includes the step of adjusting the second scale factor, where the frequency of oscillation of the mechanical resonator is adjusted in response to adjusting the second scale factor.

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

Figure 1:
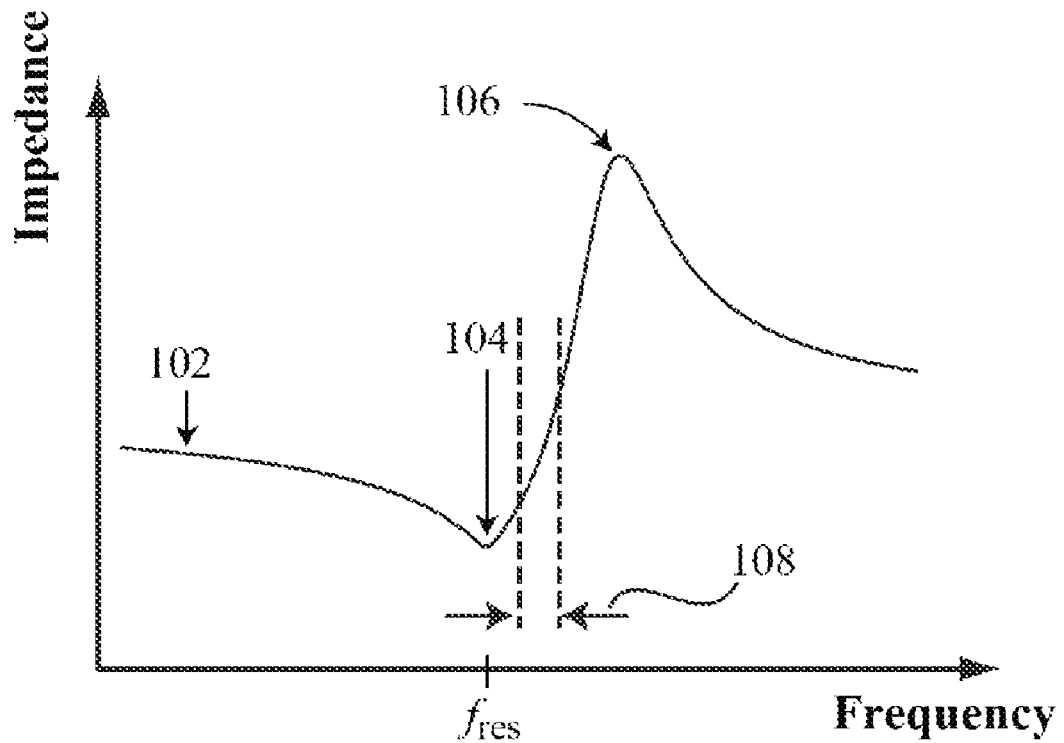
FIG. 1 shows an impedance curve for a resonator, and illustrates that conventional tuning methods allowed for tuning on only one side of the series resonance peak.

As discussed above, embodiments of the present invention relate to phase shifting circuits and in particular to a variable phase amplifier that can be used to tune a device that includes a resonator. Disclosed herein is a variable phase amplifier circuit that receives a differential signal pair, shifts the phase of the differential signal pair with respect to the input differential signal pair within a predetermined range of degrees of phase shift, and outputs the phase shifted signal. The variable phase amplifier circuits disclosed herein provides a means to adjust the amount of phase shift introduced into the output differential signal. The variable phase amplifier circuit disclosed herein provides a means to adjust the amount of phase shift introduced into the output differential signal in an accurate and stable manner. The variable phase amplifier disclosed adjusts the phase of the output differential signal without introducing common mode signal or voltage offset into the output signal. The variable phase amplifier disclosed herein is described in use with devices having resonators. It is to be understood, however, that the variable phase amplifier circuit described can be used in any electrical, mechanical, or electromechanical system, including but not limited to electronics, communications, toys, video, vehicles, or any other system.

According to one embodiment, a device having a mechanical resonator includes a variable phase amplifier circuit configured to shift the phase of the input signal(s) to and/or output signal(s) from the mechanical resonator. In some embodiments the mechanical resonator is configured in a feedback loop, for example with the variable phase amplifier circuit. Inducing a phase difference between the input signal(s) and output signal(s) of the mechanical resonator operating at a first frequency may cause the mechanical resonator to shift its operation to a second frequency. By suitably selecting the amount of phase shift induced, the device may be operated to exhibit resonant behavior at a desired resonance frequency, which frequency may differ from the inherent resonance frequency of the mechanical resonator. According to some embodiments, the variable phase amplifier may be configured to induce a suitable phase shift in the output signal(s) of the mechanical resonator and then provide the phase-shifted signal(s) back to the mechanical resonator as an input signal.

According to one embodiment of the invention, an electromechanical device includes a mechanical resonator and a variable phase amplifier. The variable phase amplifier is used to tune the oscillating frequency of the mechanical resonator. The device offers greater tuning flexibility and capability than that of conventional electromechanical resonators in that they may be tuned to exhibit resonant behavior above and below the series resonance frequency of the resonator.

According to one aspect of the technology described herein, an electromechanical device (e.g., an oscillator, a filter, a sensor, or other type of device) has a mechanical resonator that has a series resonance frequency, and the device is configured to allow for tuning of the device's frequency of operation on both sides of the series resonance frequency of the mechanical resonator. Thus, devices having mechanical resonators may be tuned to exhibit resonant behavior at a desired frequency even though the inherent resonance frequency of the mechanical resonator may not be equal to the desired resonance frequency, either because of manufacturing errors, temperature variations, or for any other reason (e.g., ambient pressure variations, package-induced stresses, or material-dependent stresses, among others). As a result, the need for strict manufacturing tolerances of the mechanical resonator may be relaxed, since the device may be accurately tuned to compensate for any deviations of the inherent resonance frequency of the mechanical resonator from the desired resonance frequency.

According to one aspect of the present invention, a frequency-tunable oscillator circuit is provided including a resonator. In some embodiments, the oscillator circuit includes a variable phase amplifier introducing a variable phase shift using amplitude scaling circuitry which provides for a variable amplitude scaling of signals. Varying the amplitude scaling provided may allow for introducing a variable phase shift in the oscillator circuit, and thus allow for tuning the frequency of the oscillator circuit. The oscillator circuit may operate on single-ended signals, differential signals, or any other suitable signals.

The aspects of the technology described above, as well as additional aspects, will now be described in greater detail. It should be appreciated that these aspects can be used alone, all together, or in any combination of two or more, and thus are not limited in this respect. Also, various embodiments will be described as including devices having mechanical resonators. It should be appreciated that such embodiments apply to any suitable types of devices, including, but not limited to, oscillators, filters, and sensors, electronic circuits, consumer electronics, or any other device.

Figure 2A:
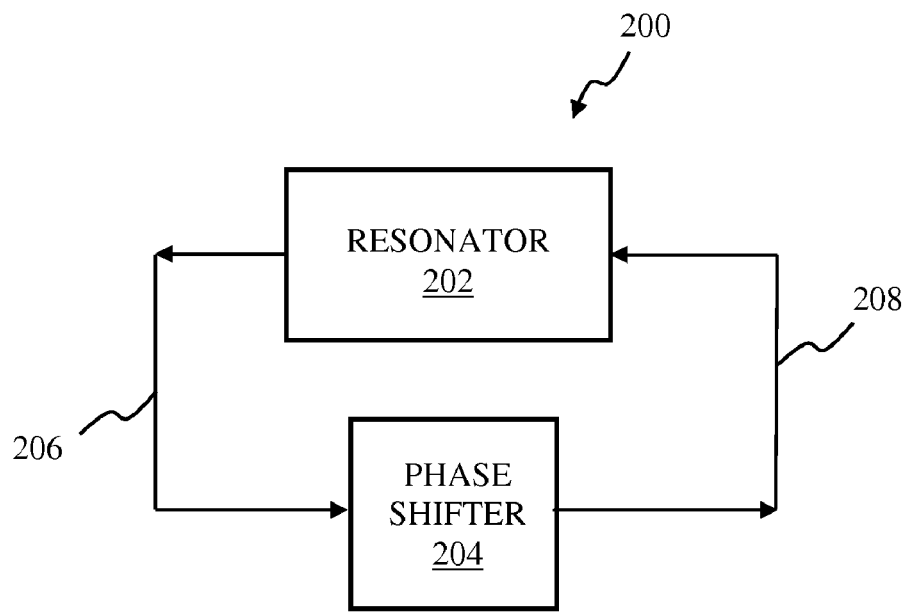
FIG. 2a shows a block diagram of an embodiment of device 200 according to the invention including resonator 202, and phase shifter 204.

As mentioned, according to one aspect of the technology described herein, a device comprising a mechanical resonator is configured to enable tuning of the device's operating frequency on either side of the series resonance frequency of the mechanical resonator (i.e., above and below the series resonance frequency). FIG. 2a illustrates one non-limiting example of such a device (which, in some embodiments, may be an oscillator), according to one embodiment. Device 200 comprises mechanical resonator 202 and phase shifter 204, configured in a feedback loop. In some embodiments resonator 202 is a type of resonator other than a mechanical resonator.

Mechanical resonator 202 may be any type of mechanical resonator, such as a microelectromechanical system (MEMS), a nanoelectromechanical system (NEMS), a bulk acoustic wave (BAW) resonator, a surface acoustic wave (SAW) resonator, a film bulk acoustic resonator (FBAR), or any other suitable resonator, as the various aspects described herein are not limited in this respect. Suitable resonators have been described, for example, in PCT Patent Publication No. WO 2006/083482, and in U.S. patent application Ser. No. 12/142,254, filed Jun. 19, 2008 and published as U.S. Pat. Pub. No. 2009/0243747 on Oct. 1, 2009, all of which are incorporated herein by reference in their entireties.

In some embodiments, mechanical resonator 202 and/or the device including mechanical resonator 202 may be formed of two or more materials, for example using two or more material layers. Thus, the operation and resonance frequency of resonator 202 and/or device in these embodiments may vary due to material-dependent stresses, for example those stresses arising due to the use of materials having different expansion coefficients. However, not all embodiments are limited in this respect. Moreover, the resonator 202 may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

Similarly, phase shifter 204 may be any suitable type of phase shifter for receiving an input signal and producing an output signal having a phase that is shifted relative to that of the input signal. It should be appreciated that phase shifter 204 may be a variable phase shifter according to some embodiments, such that the amount of phase shift provided by the phase shifter 204 may be varied.

Figure 2B:
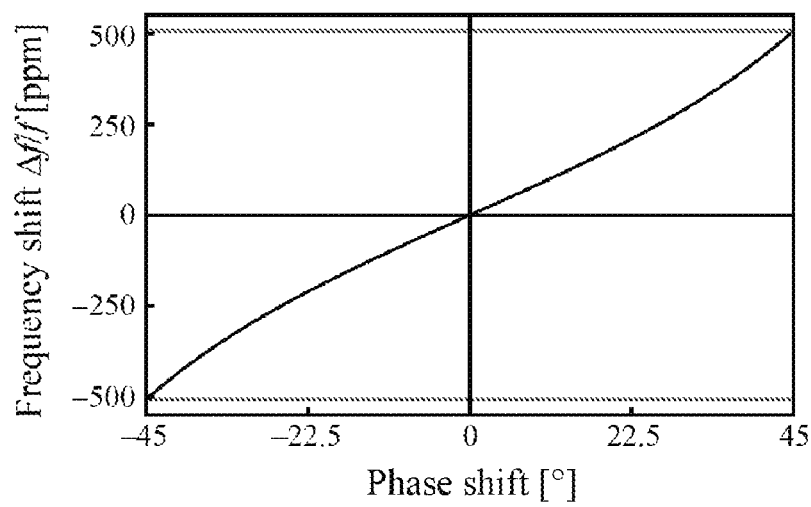
FIG. 2b is a graph showing how the frequency of resonator 202 of FIG. 2a varies as a function of the phase of phase shifted signal 208. The x-axis is the amount of phase shift introduced into signal 208 as compared to signal 206. The y axis is the amount of shift in the oscillating frequency of resonator 202.

With respect to FIG. 2a, mechanical resonator 202 produces output signal 206, having a phase, which output signal may be input to phase shifter 204. Phase shifter 204, upon receiving output signal 206 of mechanical resonator 202, shifts the phase of output signal 206 and produces phase-shifted output signal 208. Phase-shifted output signal 208 may be identical to resonator output signal 206, except for having a different phase. Phase shifted signal 208 is provided as input to resonator 202. Because the total phase shift of the resonator 202-to-phase shifter 204 loop is required to be zero, the resonator may be force to shift its frequency of oscillation in response to receiving phase-shifted signal 208, where the amount of frequency shift is a function of the amount of phase shift introduced into phase-shifted signal 208, as shown in FIG. 2b. FIG. 2b shows a graph of the shift in oscillating frequency of resonator 202 as a function of the amount of phase shift introduced into signal 208 as compared to signal 206. The oscillating frequency of resonator 202 is a function of the phase of phase-shifted signal 208. Therefore the oscillating frequency of resonator 202 can be controlled by controlling the phase of signal 208.

FIG. 2a shows one embodiment of device 200 including resonator 202 and phase shifter 204. However, the various aspects described herein are not limited in this respect. In some embodiments other elements are included in the feedback loop between the resonator output and the input to the resonator from phase shifter 204. Additional information and embodiments of device 200 and related devices is included in copending U.S. utility patent application to Reimund Rebel, et al, entitled "Methods and Apparatus for Tuning Devices Having Mechanical Resonators", Ser. No. 12/699,094, as well as copending U.S. utility patent application to Reimund Rebel, et al, entitled "Methods and Apparatus for Tuning Devices Having Mechanical Resonators", Ser. No. 12/699,095, the disclosures of which are incorporated entirely herein by reference.

In operation, resonator 202 may be induced to shift its resonance frequency by a number of degrees corresponding to the number of degrees of phase shift introduce into phase-shifted signal 208, but with an opposite sign. Thus if the total amount of phase shift provided by phase shifter 204 is greater than, zero, for example, device 200 may exhibit resonance at a frequency greater than the series resonance frequency of mechanical resonator 202. If the total amount of phase shift provided by phase shifter 204 is less than zero, device 200 may exhibit resonance at a frequency lower than the series resonance frequency of mechanical resonator 202. By varying the amount of phase shift provided by phase shifter 204, device 200 may be tuned on both sides of the series resonance peak of mechanical resonator 202, as illustrated in FIG. 3.

Figure 3:
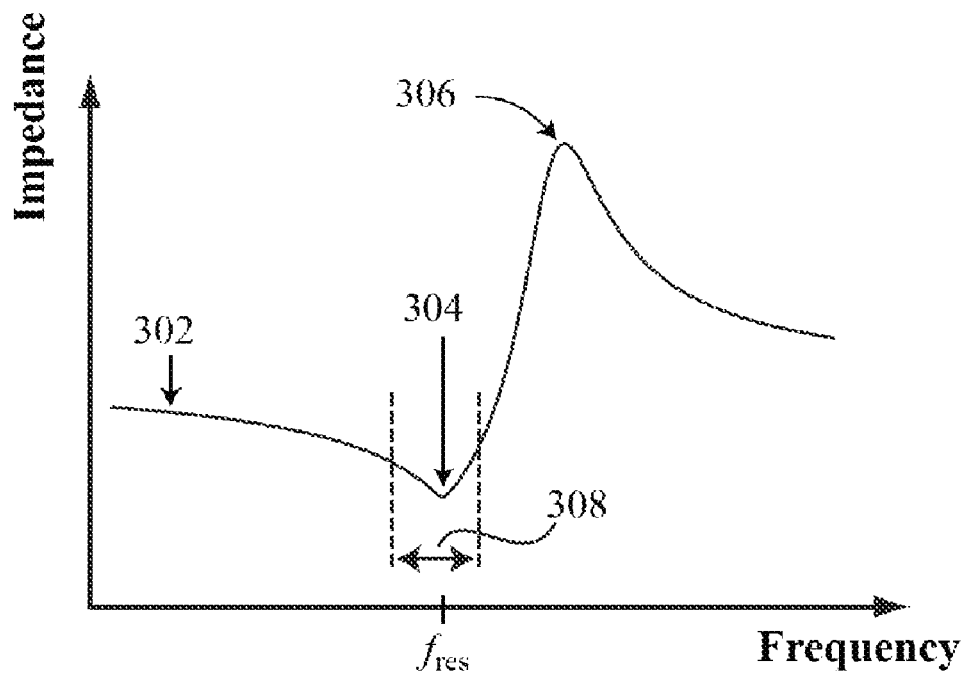
FIG. 3 shows an impedance curve for a resonator, and illustrates that using the disclosed invention allows for tuning of the resonator on both sides of the series resonance peak.

FIG. 3 is similar to FIG. 1, and illustrates impedance curve 302 for a resonator. Impedance curve 302 includes series resonance peak 304, occurring at a resonance frequency of the resonator, labeled as $f_{res}$, as well as parallel resonance peak 306. The circuit and operation described above in connection with FIG. 2a allow for tuning of a device resonance frequency on both sides of the series resonance peak 304 (i.e., at frequencies greater than or less than the series resonance frequency), as illustrated by tuning range 308. Thus, flexibility and accuracy in the tuning of a device, such as device 200, may be increased compared to conventional oscillators having mechanical resonators.

It should be appreciated that the amount of phase shift provided by phase shifter 204 may be varied, for example in those embodiments in which phase shifter 204 is a variable phase shifter. The amount of phase shift may be varied to compensate for variations in the inherent resonance frequency of mechanical resonator 202 during operation, for example including temperature-induced variations, material-stress dependent variations, ambient pressure variations, packaging-induced stress variations, or any other types of variations. For example, a calibration routine may be performed to calibrate the amount of phase shift which phase shifter 204 should provide to compensate for a given change in temperature. Similarly, a calibration routine may be performed to calibrate the amount of phase shift provided by phase shifter 204 to the resulting change in resonance frequency of the device 200. However, it should be appreciated that other methods for determining the amount of phase shift provided by phase shifter 204 may also be used, as the various aspects described herein are not limited in this respect.

It should be appreciated that various modifications and alterations of device 200 in FIG. 2a may be made while still providing the ability to tune device 200 on both sides of the series resonance peak of mechanical resonator 202.

In some embodiments the device according to the invention operates on periodic signals. Periodic signals have a phase and an amplitude. In some sinusoidal periodic signals the amplitude of the signal repeats itself every 360 degrees. The phase of sinusoidal periodic signals can therefore vary from zero to 360 degrees. A phase of a first signal is said to be the same as the phase of a second signal when they have the same phase value. A phase of a signal which has a phase of 15 degrees, for example, has the same phase as a second signal which also has a phase of 15 degrees. A phase of a first signal is said to be different from the phase of a second signal when their phase values are different. A phase of a first signal which has a phase value of 15 degrees is said to have a different phase than a phase of a second signal which has a phase of 5 degrees, for example. A first signal which has a different phase than the phase of a second signal is said to be out of phase from the first signal (and vice versa—the second signal is out of phase with respect to the first signal). A phase shift is defined as the number of degrees difference between the phases of two signals. A first signal which has a phase of 15 degrees, for example, is shifted in phase 15 degrees from a second signal which has a phase of zero degrees. The first signal also has a phase difference of 15 degrees with respect to a third signal which has a phase of 30 degrees. The periodic signals described in this document are sinusoidal periodic signals which have amplitude that repeat ever 360 degrees. However, the disclosed invention is not limited to use with sinusoidal periodic signals or with periodic signals in general, but can be used with any signal.

In some embodiments the device according to the invention may operate on differential signals (i.e., signals having equal amplitudes but being 180 degrees out-of-phase with each other) or modified differential signals (i.e., signals having two ends, which may not be equal in amplitude and/or 180 degrees out-of-phase). A differential signal is a pair of signals that includes a first end and a second end of the differential signal. As mentioned above, a true differential signal has a first end and a second end that are equal in amplitude and 180 degrees out of phase with each other. A modified differential signal has a first end and a second end, but the two ends may have different amplitudes, or they are out of phase with respect to each other by other than 180 degrees. Differential signals are generally referred to in this document as a differential signal pair. A differential signal pair includes the first end of the differential signal pair and the second end of the differential signal pair.

Figure 4:
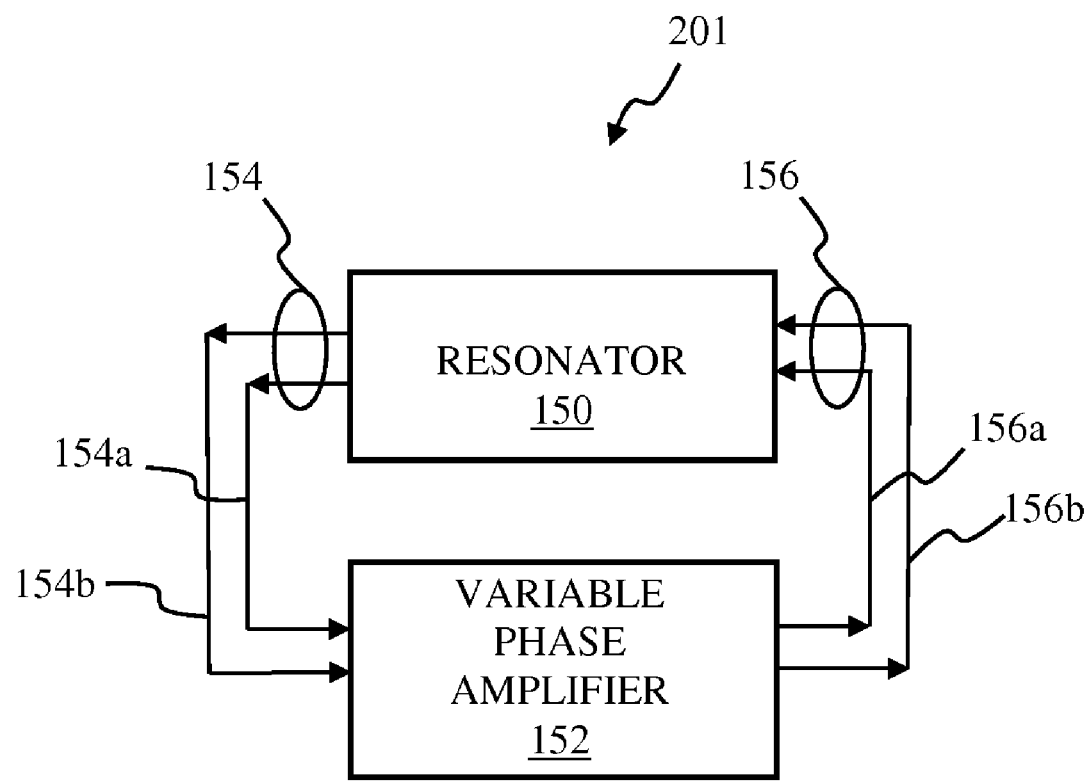
FIG. 4 shows a block diagram of an embodiment of device 201 according to the invention, where device 201 includes resonator 150 and variable phase amplifier 152 according to the invention.

Shown in FIG. 4 is device 201 according to the invention, where device 201 includes differential resonator 150 and variable phase amplifier 152. Resonator 150 in this embodiment is a differential resonator because it outputs and receives differential signal pairs. In some embodiments resonator 150 is a mechanical resonator. In some embodiments resonator 150 is a type of resonator other than a mechanical resonator. Variable phase amplifier 152 provides the phase shifting capabilities of phase shifter 204 as explained with regard to FIG. 2a and FIG. 2b, except that variable phase amplifier 152 is operating on differential signals. Variable phase amplifier 152 receives input differential signal pair 154 from resonator 154. Variable phase amplifier 152 introduces a phase shift into differential signal pair 154, outputting modified differential signal pair 156, where modified differential signal pair 156 has a phase that is shifted with respect to input differential signal pair 154. The amount of phase shift induced in modified differential signal pair 156 is variable, because variable phase amplifier 152 can introduce a variable amount of phase shift into modified differential signal pair 156 as compared to input differential signal pair 154. Modified differential signal pair 156 is fed back to resonator 150, and the oscillating frequency of resonator 150 can be adjusted by varying the amount of phase shift introduced into modified differential signal pair 156 with respect to input differential signal pair 154. The oscillating frequency of resonator 150 is a function of the phase of modified differential signal pair 156.

Input differential signal pair 154 from resonator 150 includes two ends, first end 154a and second end 154b, where the first and the second ends of signal 154 are the two distinct signals making up the output signal 154, a shown in FIG. 4. Differential signal pairs are described thus in this document, by using their number, with the first end having the 'a' designator and the second end having the 'b' designator. Input differential signal pair 154 may be a true differential signal, with the two ends 154a and 154b being equal in amplitude and 180 degrees out-of-phase with each other. However, the embodiment of FIG. 4 is not limited in this respect. Similarly, phase-shifted modified differential signal pair 156 includes two ends, 156a and 156b. Differential resonator 150 provides input differential signal pair 154, which includes first end 154a and second end 154b. Variable phase amplifier circuit 152 receives input differential signal pair 154, shifts the phase of one or both ends of signal 154, and outputs modified differential signal pair 156, which includes first end 156a and second end 156b. In some embodiments one end of signal 154 is shifted and the other end is unshifted in phase. In some embodiments both ends of signal 154 are shifted by the same amount. In some embodiments the ends of signal 154 are shifted by differing amounts. Phase shifted modified differential signal pair 156 is received by resonator 150. The resonance frequency of resonator 150 is adjusted in response to adjustments in the phase of modified differential signal pair 156. The resonance frequency of resonator 150 is a function of the phase of modified differential signal pair 156.

The above-described techniques of shifting the phases of one or both of the ends of a mechanical resonator output signal and then providing the resulting phase shifted signal to the mechanical resonator, may be performed for any reason. According to some embodiments, such a technique may be used to provide a constant (or approximately constant) input power to the resonator 150. For example, by shifting the phases of the ends of a resonator input signal relative to each other, a constant power of the input signal may be achieved, facilitating efficient operation of the resonator, for example if the input power is maintained approximately constant at a value equal to (or approximately equal to) the maximum input power which the resonator may tolerate.

According to those embodiments in which a resonator output signal has multiple ends and two or more of those ends have their phases shifted by different amounts, the difference in amount of phase shift may take any suitable value(s), and may be static or variable. For example, referring to FIG. 4, the phase of first end 154a of input differential signal pair 154 may be shifted by a first amount to produce first end 156a of modified differential signal pair 156 and the phase of second end 154b of input differential signal pair 154 may be shifted by a second amount to produce end second end 156b of modified differential signal pair 156. In some embodiments, the first amount and second amount may differ from each other by between approximately 0 and 20 degrees. In some embodiments, the first amount and second amount may differ from each by between approximately 0 and 10 degrees (e.g., 1 degree, 2 degrees, 5 degrees, etc.). In some embodiments, the first amount and second amount may differ from each other by between 10 and 20 degrees (e.g., 15 degrees). Other ranges and other values for the difference in phase shift may be employed, as the aspects described herein relating to shifting the ends of a resonator output signal by differing amounts are not limited to using any particular differing amount. Also, it should be appreciated that phase shifting the ends of a signal by differing amounts may be accomplished by shifting one of the ends and not shifting another (i.e., phase shifting one end by a non-zero amount and introducing no phase-shift in the other). In addition, as mentioned, the amount of difference may be changed over time.

In addition, it should be appreciated that the above-described techniques for shifting the ends of a resonator output signal by differing amounts may apply to any number of ends of a resonator output signal. For example, if the resonator outputs a 3-phase signal, two or more of the ends may have their phases shifted by different amounts, and then provided to the resonator as an input signal. Thus, the techniques described are not limited to use with any particular types of signals (e.g., single-ended signals, differential signals, modified differential signals, 3-phase signals, etc.).

In addition to shifting the phase(s) of signals of the mechanical resonator, the amplitude(s) may be scaled. For example, according to one embodiment, two ends of a differential output signal of a mechanical resonator may be phase shifted relative to an input signal and the amplitudes of the two ends may be different (e.g., by applying different scale factors to the two different ends). The two ends may then be fed back to the mechanical resonator as input signals. The difference in amplitudes of the two ends may further contribute to the resulting phase shift of the input signal to the mechanical resonator comprising the two ends. Thus, the amplitude of the signals may be controlled to further facilitate tuning of the mechanical resonator. Thus, it should be appreciated that a combination of phase-shifting and amplitude scaling of ends of a signal (e.g., an input signal to the mechanical resonator) may be performed to generate a desired phase difference between the ends. According to one embodiment, an output signal from a mechanical resonator may comprise a first end and a second end, which may then be phase shifted and scaled by different amounts to create a modified signal supplied to the mechanical resonator as an input signal. Other manners of operation are also possible.

In some embodiments of the invention, variable phase amplifier 152 scales the amplitude of the two ends of the signal from a mechanical resonator as a method of accomplishing phase shifting of the signal. According to one embodiment, an output signal from a mechanical resonator comprises a first end a second end. Amplitude scaling is used to accomplish phase shifting of one or both of the ends of the signal to create a modified phase shifted signal supplied to the mechanical resonator as an input signal. In this embodiment tuning of the resonance frequency of the mechanical resonator is accomplished by adjusting the scale factors used on the first and second ends of the signal.

Various non-limiting examples of circuits implementing one or more of the techniques described above are now provided for purposes of illustration. It should be appreciated that other circuit designs in accordance with one or more of the aspects described herein are possible, and that variations on those circuits now illustrated are also possible. The following circuits may be implemented as integrated circuits (e.g., as silicon circuitry in silicon substrates) or in other forms, and thus may be used as part of, or in combination with, MEMS devices including mechanical resonators of the types described herein.

FIG. 5 through FIG. 16 show various embodiments of device 201 or various embodiments of variable phase amplifier circuit 152, also referred to as variable phase amplifier 152, and components of variable phase amplifier 152 that can be used in or with device 201. Described is embodiments of variable phase amplifier 152 which can be used to introduce a variable amount of phase shift into input differential signal 154 received from resonator 150, and provide phase shifted modified differential signal pair 156 to resonator 150. The variable amount of phase shift introduced into modified differential signal pair 156 can be used to tune the oscillating frequency of resonator 150. Any of these embodiments can be used alone or in combination with device 201 according to the invention as shown in FIG. 4. In some embodiments other circuits and elements are included in device 201 according to the invention.

Figure 5:
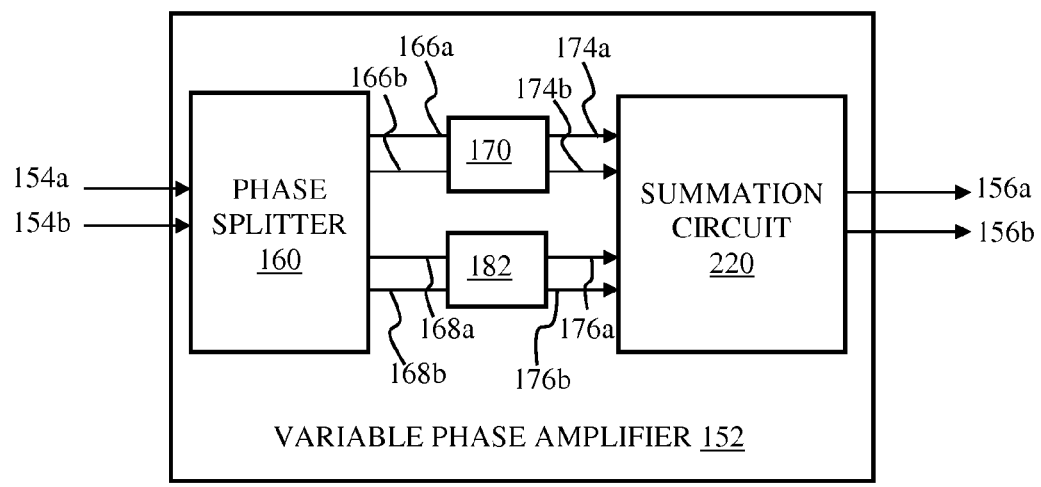
FIG. 5 shows a block diagram of one embodiment of variable phase amplifier 152 of FIG. 4.

FIG. 5 shows a block diagram of one embodiment of variable phase amplifier 152 according to the invention. Variable phase amplifier 152 in this embodiment includes phase splitter 160, first variable gain amplifier circuit 170, second variable gain amplifier circuit 182, and summation circuit 220. Phase splitter circuit 160 receives input differential signal pair 154, which includes input differential signal pair first end 154a and input differential signal pair second end 154b. Input differential signal pair 154 has a phase and an amplitude. In some embodiments input differential signal pair second end 154b is 180 degrees out of phase with input differential signal pair first end 154a. In some embodiments input differential signal pair second end 154b is some other number of degrees out of phase with input differential signal pair first end 154a. Phase splitter 160 generates first differential signal pair 166 in response to receiving input differential signal pair 154. First differential signal pair 166 includes first differential signal pair first end 166a and first differential pair second end 166b. In some embodiments first differential signal pair second end 166b is 180 degrees out of phase with first differential signal pair first end 166a. In some embodiments first differential signal pair second end 166b is some other number of degrees out of phase with first differential signal pair first end 166a. Phase splitter 160 generates second differential signal pair 168 in response to receiving input differential signal pair 154. Second differential signal pair 168 includes second differential signal pair first end 168a and second differential pair second end 168b. In some embodiments second differential signal pair second end 168b is 180 degrees out of phase with second differential signal pair first end 168a. In some embodiments second differential signal pair second end 168b is some other number of degrees out of phase with second differential signal pair first end 168a. Phase splitter 160 can generate first differential signal pair 166 and second differential signal pair 168 in many ways, some examples of which will be discussed shortly. In some embodiments first differential signal pair 166 is the same signal as input differential signal 154, where being the same means each end of input differential signal pair 154 passes through phase splitter 160 unchanged in amplitude or phase. In some embodiments second differential signal pair 168 is the same as input differential signal pair 154. In some embodiments both first differential signal pair 166 and second differential signal pair 168 are different in phase and/or amplitude with respect to input differential signal pair 154. In some embodiments first differential signal pair 166 is out of phase with second differential signal pair 168. First differential signal pair 166 and second differential signal pair 168 can be out of phase with respect to each other by any number of degrees. In some embodiments first differential signal pair 166 is 90 degrees out of phase with second differential signal pair 168.

First variable gain amplifier circuit 170 receives first differential signal pair 166 and generates first scaled differential signal pair 174 in response. First variable gain amplifier 170 in this embodiment scales the amplitude of first differential signal pair 166 by a first scale factor. Scaling refers to modifying the amplitude of a signal and includes attenuating a signal amplitude, amplifying a signal amplitude, scaling a signal by a zero scale factor (extinguishing a signal), or scaling by a unity scale factor, which means leaving the amplitude of the signal unchanged. When a signal is scaled by a scale factor greater than one, the amplitude of the scaled signal is greater than the amplitude of the input signal (the signal is amplified). When a signal is scaled by a unity scale factor, the amplitude of the scaled signal is equal to, or unchanged from, the amplitude of the input signal. When a signal is scaled by a scale factor that is less than one, the amplitude of the output signal is smaller than the amplitude of the input signal (the signal is attenuated). When a signal is scaled by a scale factor equal to zero, the output signal has a zero amplitude, meaning that the signal has been extinguished.

In this embodiment first variable gain amplifier circuit 170 first scale factor is variable, meaning that the first scale factor is an adjustable value. The first scale factor is adjustable from zero through one to a first maximum scale factor that is often greater than two, although this range is not limiting. The first maximum scale factor can be any value. First variable gain amplifier circuit 170 scales both first end 166*a* and second end 166*b* by the first scale factor. First variable gain amplifier circuit 170 outputs first scaled differential signal pair 174 in response to receiving first differential signal pair 166. First scaled differential signal pair first end 174*a* is first differential signal pair 166*a* scaled by the first scale factor. First scaled differential signal pair second end 174*b* is first differential signal pair 166*b* scaled by the first scale factor. In this way first variable gain amplifier 170 outputs first scaled differential signal pair 174 in response to receiving first differential signal pair 166, where first scaled differential signal pair 174 corresponds to first differential signal pair 166 scaled by the first scale factor. The amplitude of first scaled differential signal pair 174 is adjustable in amplitude within a range from zero amplitude to the amplitude of first differential signal pair 166 scaled by the first maximum scale factor value.

Similarly, second variable gain amplifier circuit 182 receives second differential signal pair 168, and outputs second scaled differential signal pair 176 in response. Second scaled differential signal pair first end 176*a* is second differential signal pair first end 168*a* scaled by the second scale factor. Second scaled differential signal pair second end 176*b* is second differential signal pair second end 168*b* scaled by the second scale factor. The second scale factor is adjustable from zero to a maximum second scale factor value, which is often greater than 2, but is not limited to this value. The maximum second scale factor can be any value. Second variable gain amplifier 182 outputs second scaled differential signal pair 176 in response to receiving second differential signal pair 168, where second scaled differential signal pair 176 corresponds to second differential signal pair 168 scaled by the second scale factor. The amplitude of second scaled differential signal pair 176 is adjustable in amplitude within a range from zero amplitude to the amplitude of second differential signal pair 168 scaled by the second maximum scale factor value.

In some embodiments the first maximum scale factor value is the same as the second maximum scale factor value. In some embodiments the first maximum scale factor value is a different value than the second maximum scale factor value. In some embodiments the first scale factor is adjusted to be the same value as the second scale factor. In some embodiments the first scale factor is adjusted to be a different value than the second scale factor.

Summation circuit 220 creates modified differential signal pair 156 in response to receiving first scaled differential signal pair 174 from first variable gain amplifier 170 and second scaled differential signal pair 176 from second variable gain amplifier 182. Summation circuit 220 sums together first scaled differential signal pair 174 and second scaled differential signal pair 176 to create modified differential signal pair 156. Modified differential signal pair 156 has a phase and an amplitude. In some embodiments modified differential signal pair 156 has been shifted in phase with respect to input differential signal pair 154. Thus in some embodiments modified differential signal pair 156 has a phase that is different than the phase of input differential signal pair 154. In some embodiments the amount of phase shift between modified differential signal pair 156 and input differential signal pair 154 is determined by the method used to sum first scaled differential signal pair 174 and second scaled differential signal pair 176. In some embodiments the amount of phase shift between modified differential signal pair 156 and input differential signal pair 154 is adjusted by adjusting the first scale factor. In some embodiments the amount of phase shift between modified differential signal pair 156 and input differential signal pair 154 is a function of the first scale factor. In some embodiments the amount of phase shift between modified differential signal pair 156 and input differential signal pair 154 is adjusted by adjusting the second scale factor. In some embodiments the amount of phase shift between modified differential signal pair 156 and input differential signal pair 154 is a function of the second scale factor. In some embodiments the amount of phase shift introduced into modified differential signal pair 156 is adjustable. Some of the specific methods used for summing first scaled differential signal pair 174 and second scaled differential signal pair 176 will be discussed shortly. Modified differential signal pair 156 is provided to differential resonator 150 as shown in FIG. 4. The phase shift between input signal 154 and modified differential signal 156 is used to adjust the operating frequency of resonator 150. In those embodiments where the phase shift between input differential signal pair 154 and modified differential signal pair 156 is adjustable, the oscillating frequency of resonator 150 is adjustable. In this way variable phase amplifier circuit 152 can be used to shift the phase of a differential signal pair. In this way variable phase amplifier 152 can be used to adjust the operating frequency of a mechanical resonator.

Figure 6:
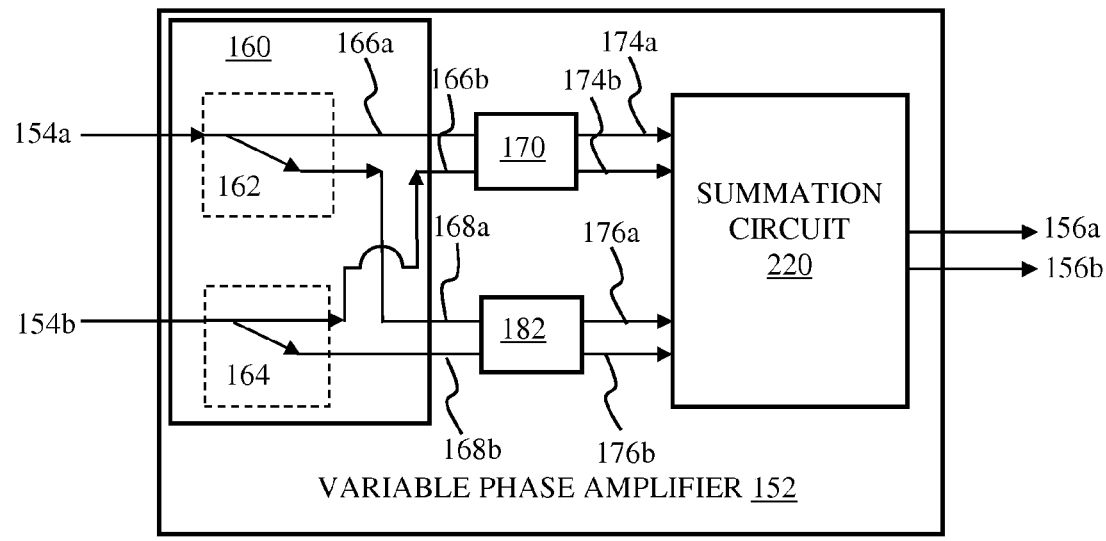
FIG. 6 shows a block diagram of another embodiment of variable phase amplifier 152 of FIG. 4.

FIG. 6 shows a block diagram of another embodiment of variable phase amplifier 152 according to the invention. In this embodiment phase splitter 160 includes first phase splitter stage 162 and second phase splitter stage 164. First phase splitter stage 162 receives input differential signal pair first end 154*a*, and generates second differential signal pair first end 168*a* by phase splitting second differential signal pair first end 168*a* from input differential signal pair first end 154*a*. In this embodiment second differential signal pair first end 168*a* has a phase that is different than the phase of input differential signal pair first end 154*a*. Second differential signal pair first end 168*a* can be different in phase from input differential signal pair first end 154*a* by any number of degrees. The amount of phase difference between second differential signal pair first end 168*a* and first differential signal pair first end 154a is determined by the specific circuit implementation of first phase splitter stage 162.

In the embodiment of phase splitter 160 shown in FIG. 6, input differential signal pair first end 154a passes through first phase splitter stage 162 unchanged, and is output from phase splitter 160 as first differential signal pair first end 166a. In this embodiment first differential signal pair first end 166a has a phase that is the same as input differential signal pair first end 154a. In this embodiment first differential signal pair first end 166a is the same as input differential signal pair first end 154a, meaning first differential signal pair first end 166a has the same amplitude and phase as input differential signal pair first end 154a.

Second phase splitter stage 164 receives input differential signal pair second end 154b, and generates second differential signal pair second end 168b by phase splitting second differential signal pair second end 168b from input differential signal pair second end 154b. In this embodiment second differential signal pair second end 168b has a phase that is different than the phase of input differential signal pair second end 154b. Second differential signal pair second end 168b can be different in phase from input differential signal pair second end 154b by any number of degrees. The amount of phase difference between second differential signal pair second end 168b and first differential signal pair second end 154b is determined by the specific circuit implementation of second phase splitter stage 164.

In the embodiment of phase splitter 160 shown in FIG. 6, input differential signal pair second end 154b passes through second phase splitter stage 164 unchanged, and is output from phase splitter 160 as first differential signal pair second end 166b. In this embodiment first differential signal pair second end 166b has a phase that is the same as input differential signal pair second end 154b. In this embodiment first differential signal pair second end 166b is the same as input differential signal pair second end 154b, meaning first differential signal pair second end 166b has the same amplitude and phase as input differential signal pair second end 154b.

First and second variable gain amplifier 170 and 182, and summation circuit 220 as shown in the embodiment of variable phase amplifier 152 in FIG. 6 are the same or similar to the corresponding components shown in FIG. 5. Variable phase amplifier 152 according to the invention as shown in FIG. 6 can be variable gain amplifier 152 as shown in FIG. 4.

Figure 7:
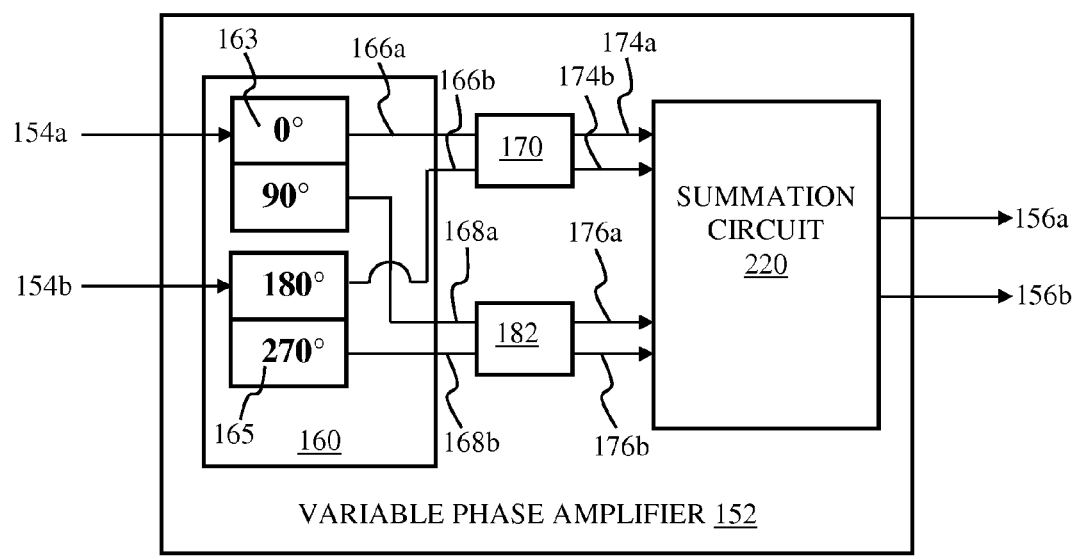
FIG. 7 shows a block diagram of a further embodiment of variable phase amplifier 152 of FIG. 4.

FIG. 7 shows a block diagram of a further embodiment of variable phase amplifier 152 according to the invention. In this embodiment input differential signal pair 154 first end 154a and second end 154b are 180 degrees out of phase with each other. Input differential signal 154 is defined as being the reference signal, with input differential signal pair first end 154a defined to have a phase of zero degrees. Therefore input differential signal pair second end 154b has a phase of 180 degrees. In this embodiment phase splitter 160 includes first phase splitting stage 163 and second phase splitting stage 165. In this embodiment input differential signal pair 154 passes through phase splitter 160 unchanged in amplitude and phase and is output from phase splitter 160 as first differential signal pair 166, as described earlier with respect to FIG. 6. Therefore first differential signal pair first end 166a is output from phase splitter 160 with a zero degree phase, and first differential signal pair second end 166b is output from phase splitter 160 with a 180 degree phase.

Second differential signal 168 is phase split from input differential signal pair 154 with a resulting phase difference between the two signals of 90 degrees. Therefore, as shown in FIG. 7, second differential signal pair first end 168a is split from input differential pair first end 154a by 90 degrees, such that second differential signal pair first end 168a has a phase of 90 degrees. Second differential signal pair second end 168b is split from input differential signal pair second end 154b by a phase of 90 degrees, such that second differential signal pair second end 168b has a phase of 270 degrees.

Figure 8:
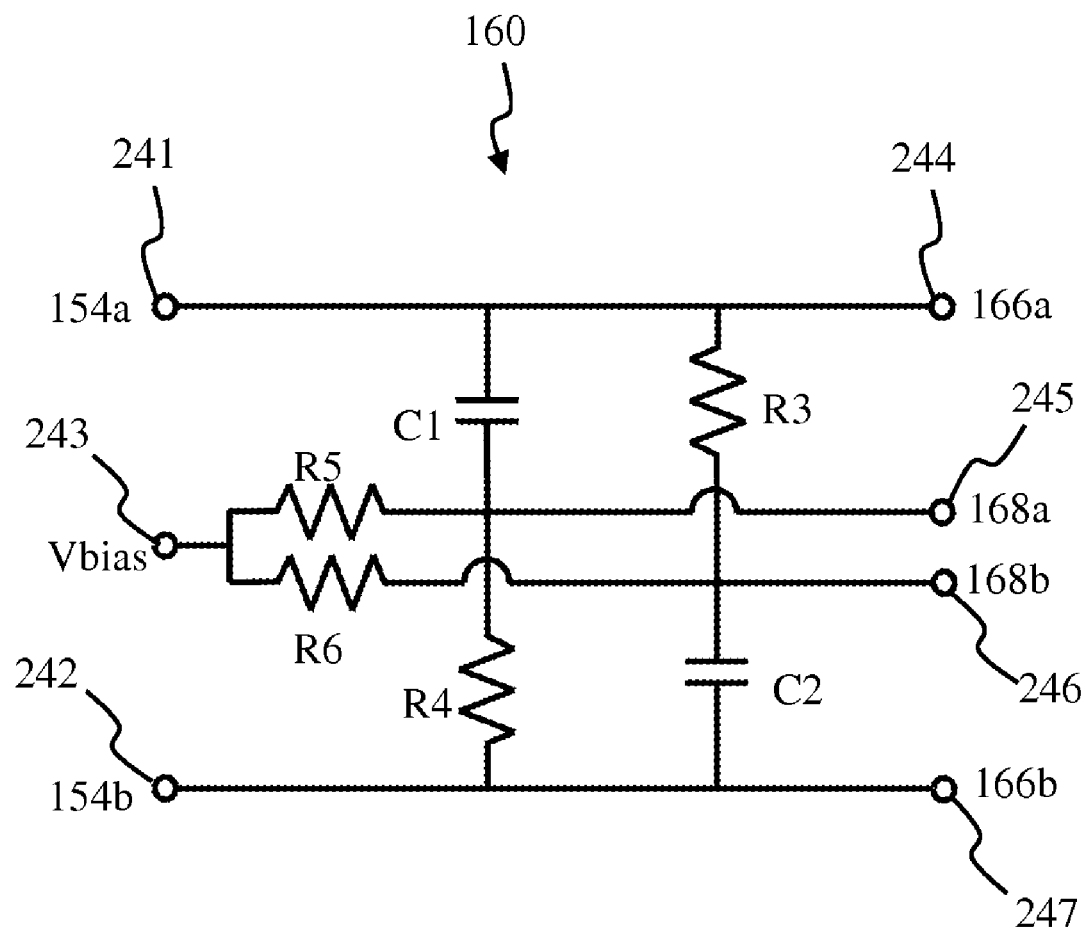
FIG. 8 shows a schematic diagram of phase shifter 160 of variable phase amplifier 152 according to the invention of either FIG. 5 or of FIG. 7.

A schematic diagram of one embodiment of phase splitter circuit 160 of FIG. 7 is shown in FIG. 8. Input differential signal pair 154 is presented to input ports 241 (154a) and 242 (154b). Bias voltage Vbias is provided to input port 243. First differential signal pair 166 is output from nodes 244 and 247, and second differential signal pair is output from nodes 245 and 246 as shown. Resistors R5 and R6 are chosen to have high impedance values to isolate Vbias from the phase splitter stages. In this embodiment shown in FIG. 8, R3 has the same resistance value as R4, and C1 has the same capacitance value as C2. R4 and C1 comprise first phase splitter stage 163, and are chosen such that the resistance value of R4 is equal to the reactance of C1 at the resonance frequency. R3 and C2 comprise second phase splitter stage 165. In this case the magnitude of the voltage division performed is ½ and the magnitude of each of the output signals is the same. It is to be understood that phase splitter 160 and first and second phase splitter stages 163 and 164 can be formed by devices and components other than those shown in FIG. 8.

In the embodiment of variable phase amplifier 152 shown in FIG. 7, variable gain amplifier 170 receives first differential signal pair 166, where the phase of first differential signal pair second end 166b is 180 degrees out of phase with first differential signal pair first end 166b. And variable gain amplifier 182 receives second differential signal pair 168, where the phase of second differential signal pair second end 168b is 180 degrees out of phase with second differential signal pair second end 166b. Thus in this embodiment first and second variable gain amplifier circuits 170 and 182 receive first and second differential signal pairs 166 and 168, where both first differential signal pair 166 and second differential signal pair 168 are true differential signal pairs, with a phase difference between their respective first and second ends of 180 degrees.

Figure 9:
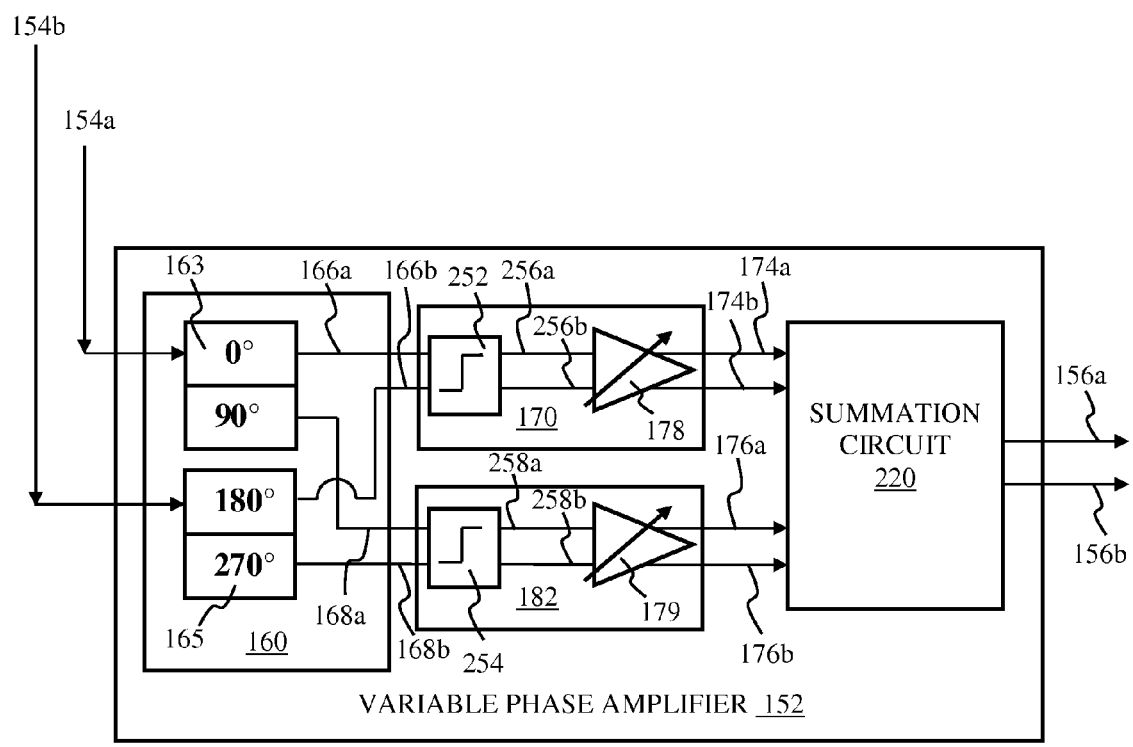
FIG. 9 shows a block diagram of another embodiment of variable phase amplifier 152 of FIG. 4.

FIG. 9 shows a further embodiment of variable phase amplifier circuit 152 according to the invention. In the embodiment of variable phase amplifier 152 shown in FIG. 9, phase splitter 160 is phase splitter 160 from FIG. 8 and FIG. 9. According to this embodiment of variable phase amplifier 152, first and second variable gain amplifiers 170 and 182 each includes a limiter stage and an amplifier stage. First variable gain amplifier circuit 170 includes limiter stage 252 and variable gain amplifier stage 178. Limiter stage 252 receives first differential signal pair 166, and outputs first amplitude-limited differential signal pair 256. Limiter stage 252 limits the amplitude (maximum deviation of the signal from its average value) of amplitude-limited differential signal pair 256 to a first predetermined maximum amplitude value. If the amplitude of first differential signal pair 166 increases above the first maximum amplitude value, then the amplitude of first amplitude-limited differential signal pair 256 is set to the first maximum amplitude value. If the amplitude of first differential signal pair 166 is below the first maximum amplitude value, then first amplitude-limited differential signal pair retains the amplitude of first differential signal pair 166.

Variable gain amplifier stage 178 receives amplitude-limited differential signal pair 256, and scales the amplitude by a first scale factor, where the first scale factor is adjustable. Scaling the amplitude means multiplying the amplitude of the signal by a scale factor as discussed earlier, where the scale factor can be a numerical value, often having a range between zero and 10, including values less than one, values of one, and values of zero. Scaling therefore includes attenuating a signal's amplitude, which occurs when the scale factor is less than one. Scaling also include leaving the amplitude unchanged, which occurs when the scale factor is one. Scaling includes extinguishing the signal, as when the scale factor is zero. And scaling includes amplifying the signal amplitude, which occurs when the scale factor is greater than one. For example, if an input signal is scaled by a scale factor of 0.5, the output signal will have an amplitude that is half of the amplitude of the input signal. As another example, if the scale factor is one, the output signal will have the same amplitude as the input signal, and the input signal is unchanged in amplitude from the output signal. As another example, a scale factor of 1.5 will generate an output signal that has an amplitude 1.5 times the amplitude of the input signal. Variable gain amplifier stage 178 receives amplitude-limited differential signal pair 256, scales amplitude-limited differential signal pair 256 by a first scale factor, and outputs first scaled differential signal pair 174. The amplitude of first scaled differential signal pair 174 is adjustable by adjusting the first scale factor.

Second variable gain amplifier circuit 182 receives second differential signal pair 168 and outputs second scaled differential signal pair 176 in response. Second variable gain amplifier circuit 182 includes limiter stage 254 and variable gain amplifier stage 179. Limiter stage 254 receives second differential signal pair 168, and outputs second amplitude-limited differential signal pair 258. Limiter stage 254 limits the amplitude of amplitude-limited differential signal pair 258 to a second predetermined maximum amplitude value. If the amplitude of second differential signal pair 168 increases above the second maximum amplitude value, then the amplitude of second amplitude-limited differential signal pair 258 is set to the second maximum amplitude value. If the amplitude of second differential signal pair 168 is below the second maximum amplitude value, then second amplitude-limited differential signal pair retains the amplitude of second differential signal pair 168. In some embodiments the second maximum amplitude value is the same value as the first maximum amplitude value. In some embodiments the second maximum amplitude value is a different value than the first maximum amplitude value.

Variable gain amplifier stage 179 receives amplitude-limited differential signal pair 258, and scales the amplitude by a second scale factor. The second scale factor is adjustable. Scaling the amplitude means multiplying the amplitude of the signal by a scale factor as discussed earlier, where the scale factor is a numerical value, often between zero and 10, including values less than one, values of one, and values of zero. Scaling therefore includes attenuating a signal's amplitude, amplifying the signal amplitude, extinguishing the signal, or passing the signal through unchanged, as discussed earlier with respect to variable gain amplifier stage 178. Variable gain amplifier 179 scales amplitude-limited differential signal pair 258 by a second scale factor and outputs second scaled differential signal pair 176. The amplitude of second scaled differential signal pair 176 is adjustable by adjusting the second scale factor.

In some embodiments the first scale factor is the same value as the second scale factor. In some embodiments the first scale factor is a different value than the second scale factor.

Second scaled differential signal pair 176 and first scaled differential signal pair 174 can have the same amplitude, or they can have different amplitudes. The amplitude of second scaled differential signal pair 176 and first scaled differential signal pair 174 can be adjusted individually or together by adjusting the first scale factor and the second scale factor individually or together, respectively.

Variable phase amplifier 152 as shown in FIG. 9 can be variable phase amplifier 152 shown in FIG. 4.

Figure 10:
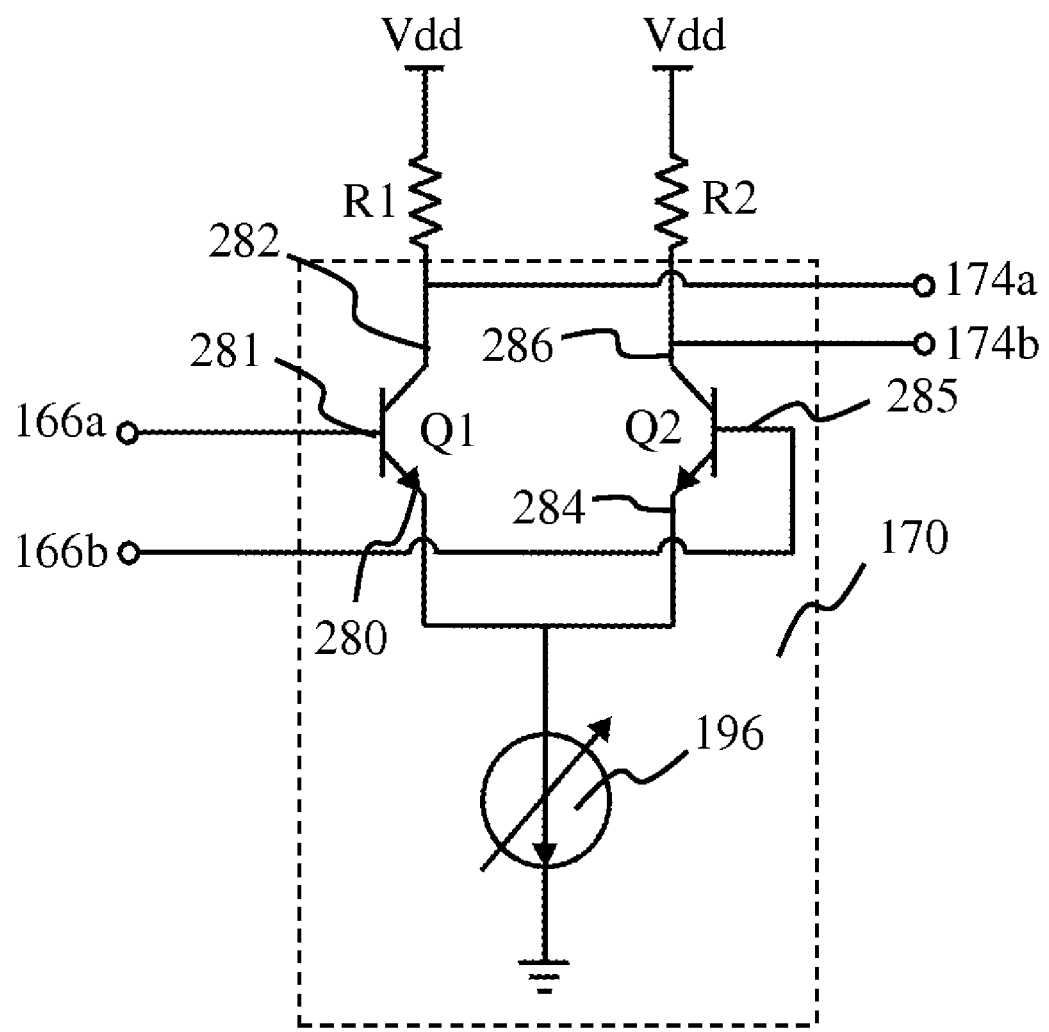
FIG. 10 shows a schematic diagram of one embodiment of variable gain amplifier 170 according to the invention of FIG. 9.

FIG. 10 shows an embodiment of first variable gain amplifier circuit 170 of FIG. 9. In this embodiment variable gain amplifier 170 is implemented as a variable transconductance amplifier. Transistors Q1 and Q2 receive first differential signal pair 166 at base nodes 281 and 285 as shown. Transistors Q1 and Q2 amplify the voltage difference between the two ends of first differential signal pair 166, and converts this difference into an amplified current signal at collector nodes 282 and 286, where first scaled differential signal output 174 can be output. Transistors Q1 and Q2 can be amplitude-limiting transistors and therefore perform the limiting function of limiter stage 252 as shown in FIG. 9. Adjustable current source 196 can be used to adjust the first scale factor of variable gain amplifier 170. Adjusting the first scale factor adjusts the resulting amplitude of first scaled differential signal pair 174.

Figure 15:
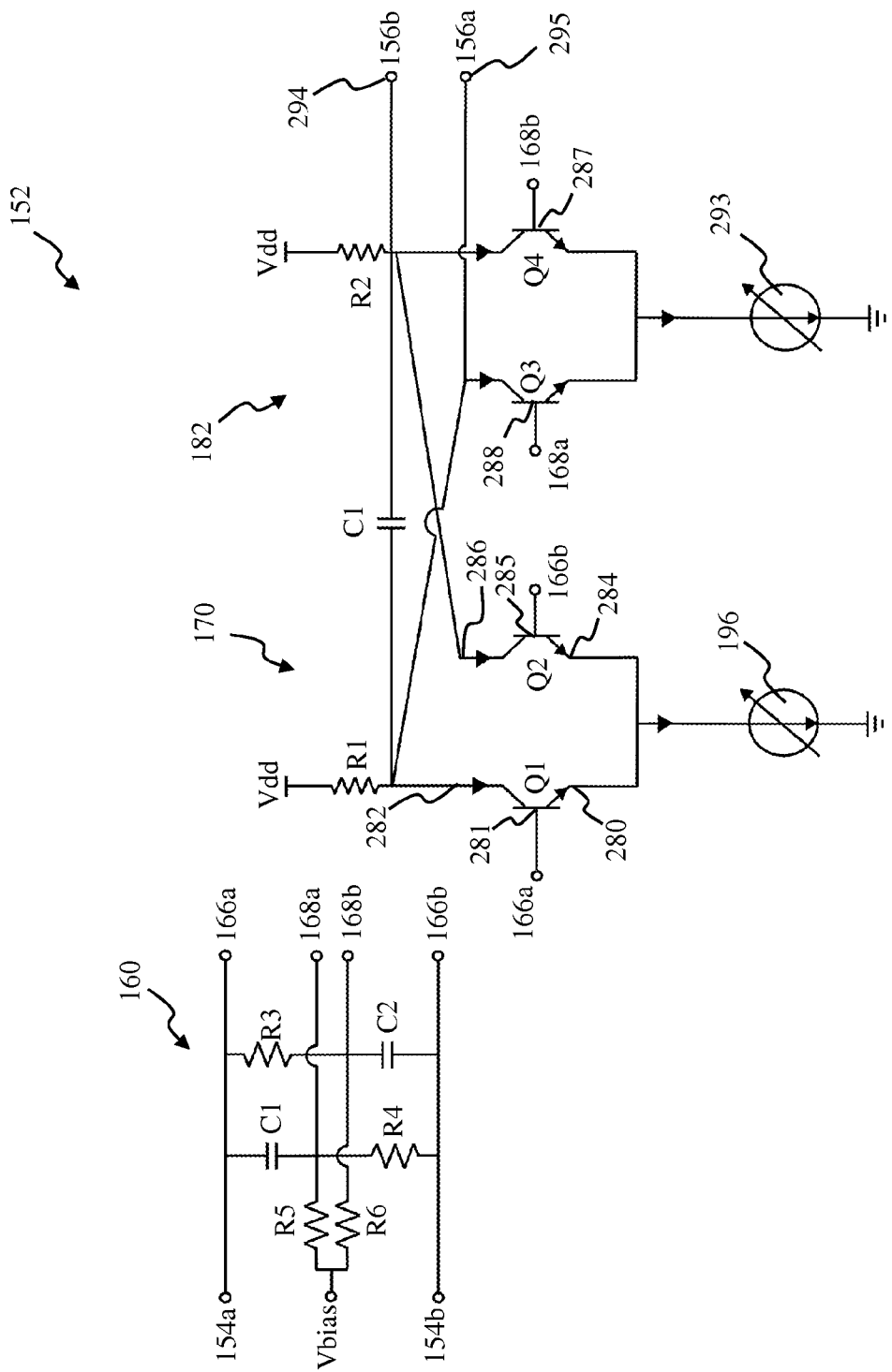
FIG. 15 is a schematic diagram of one embodiment of variable phase amplifier 152 of FIG. 14.
Figure 16:
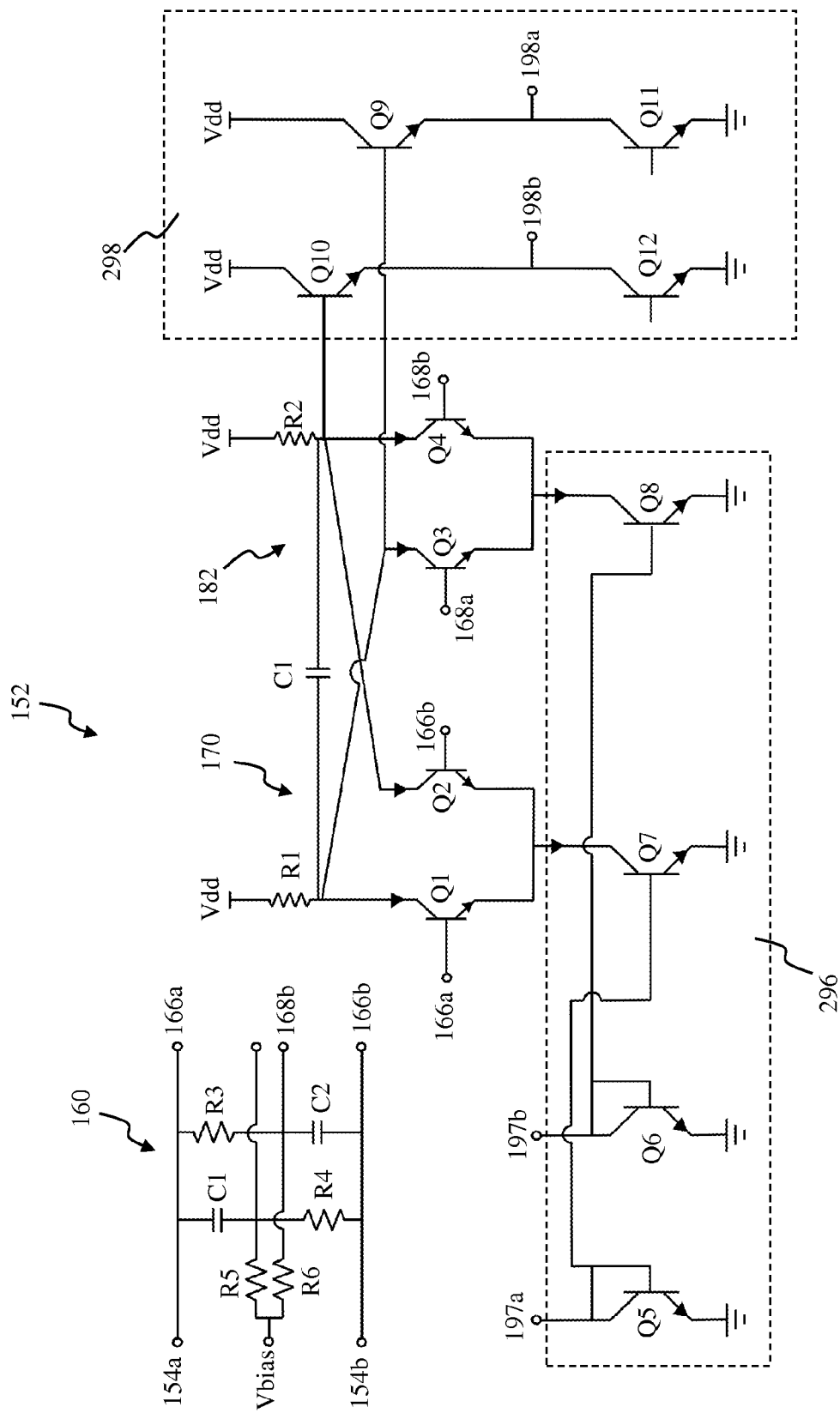
FIG. 16 is a schematic diagram of a further embodiment of variable phase amplifier 152 of FIG. 14.

In the example embodiment of variable phase amplifier 152 as shown in FIG. 9 and FIG. 10, second variable gain amplifier 182 has the same circuit diagram as that illustrated for first variable gain amplifier 170 (see FIG. 15 and FIG. 16). It is to be understood that FIG. 10 is an example schematic of one embodiments of variable gain amplifier 170 that can be used in variable phase amplifier 152. Variable gain amplifier 170 can be formed from other transistors, integrated circuits, or components as is known in the art now or in the future for forming variable gain amplifier circuits. Variable gain amplifier 152 as shown in FIG. 9, and FIG. 10 can be used in device 201 as shown in FIG. 4 to tune the resonance frequency of resonator 150.

Figure 11:
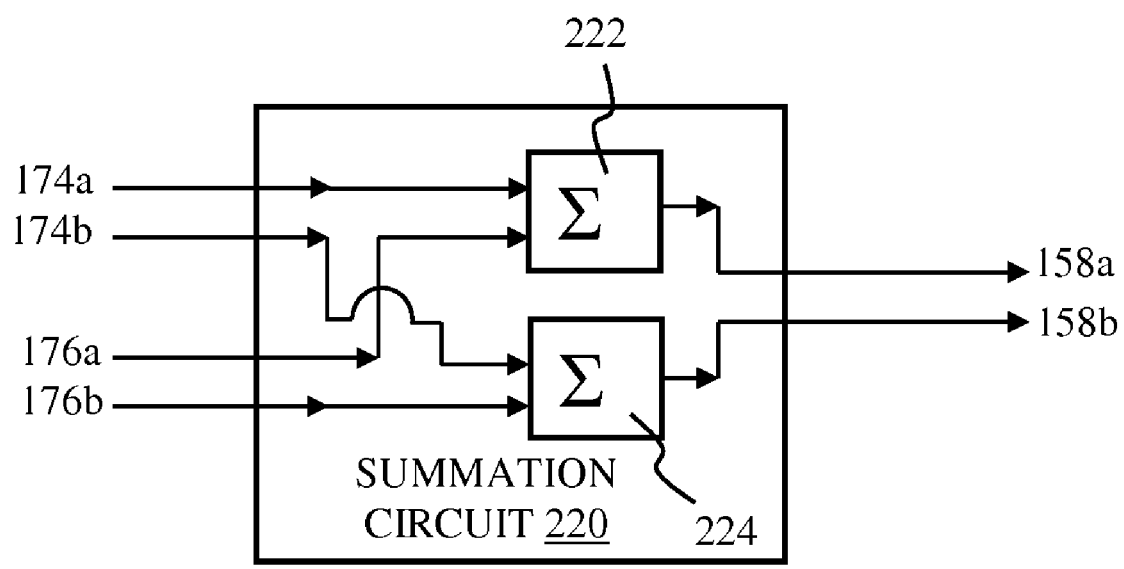
FIG. 11 shows a block diagram of one embodiment of summation circuit 220 of variable phase amplifier 152 according to the invention. Summation circuit 220 of FIG. 11 can be included in variable phase amplifier 152 of FIG. 4, FIG. 5, FIG. 6, FIG. 7, or FIG. 9.

FIG. 11 shows an example embodiment of summation circuit 220, which can be used in variable gain amplifier 152 of FIG. 5, FIG. 6, FIG. 7, or FIG. 9. Summation circuit 220 includes first summation stage 222 and second summation stage 224. In this embodiment first summation stage 222 sums first scaled differential pair first end 174*a* and second scaled differential signal pair first end 176*a* to create summed differential signal pair first end 158*a*. Similarly, second summation stage 224 sums first scaled differential signal pair second end 174*b* and second scaled differential signal pair second end 176*b* to create summed differential signal pair second end 158*b*.

Figure 12:
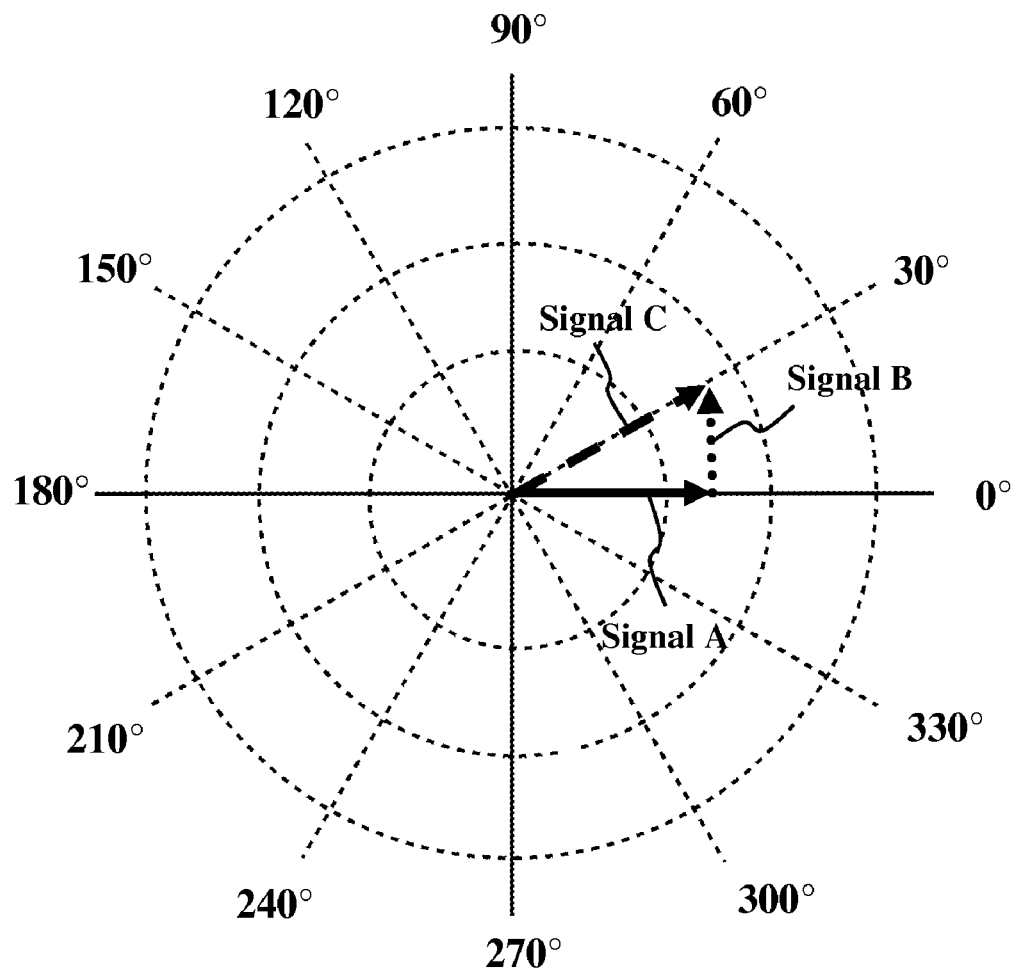
FIG. 12 Illustrates vector addition of two signals, signal A and signal B, where each of signal A and signal B has a phase and an amplitude. Signal C is the sum of signal A and signal B. The phase and amplitude of signal C is a function of the phase and amplitude of signal A and signal B.

First summation stage 222 and second summation stage 224 perform vector addition on their respective input signal pairs. The resulting summed signal vector has a phase and amplitude that depends on the respective phase and amplitude of the two input signals. Vector addition of two signals, where each signal has a phase and an amplitude, is illustrated in FIG. 12. Two signals are being summed, signal A, represented by the solid line arrow, and signal B, represented by the dotted line arrow. The two input signals are plotted on radial coordinates where the length of the signal arrow represents the amplitude of the signal, and the phase of the signal is represented by the angular direction of the signal arrow. Shown in FIG. 12 is the addition of two signals, signal A and signal B, where signal A has a phase of zero degrees, and signal B has a phase of 90 degrees. Signal C is shown in dashed lines in FIG. 12. Signal C is the vector addition of signal A and signal B, and has a phase of 30 degrees in this specific example, and an amplitude represented by the length of the signal C arrow. It can be seen that the phase and the amplitude of the sum of two signals can be controlled and adjusted by controlling and adjusting the phase and amplitude of the two signals being summed. For instance, if the phase of signal A is zero degrees, and the phase of signal B is 90 degrees, as shown in the example illustrated in FIG. 12, the resulting summed signal C will have a phase that can range from zero to 90 degrees, with the specific summed signal C phase depending on the amplitude of the input signals. Furthering this example, if signal B has an amplitude of zero, the phase of summed signal C will have a phase of 0 degrees and an amplitude equal to the amplitude of signal A. Similarly, if signal A has an amplitude of zero, the phase of summed signal C will have a phase of 90 degrees, with an amplitude equal to the amplitude of signal B. As the amplitudes of signal and signal B are varied, the amplitude of summed signal C will vary in length, with a phase between zero and 90 degrees. Thus is can be seen that the phase of the sum of two signals, where each signal has a phase and an amplitude, can be adjusted by adjusting the amplitude of the two signals being summed. It can be further seen that by adjusting the amplitude of the two signals being summed, the phase of the summed signal can be adjusted within a range defined by the phase of the two signals being summed.

Thus it is to be understood that the range of possible phase values of summed signal C can be chosen by proper choice of the phase for input signals A and B. When signal A has a phase of 90 degrees and signal B has a phase of 180 degrees, summed signal C will have a phase within the range of 90 to 180 degrees. When signal A has a phase of 180 degrees and signal B has a phase of 270 degrees, summed signal C will have a phase within the range of 180 to 270 degrees. When signal A has a phase of 270 degrees and signal B has a phase of 360 degrees, summed signal C will have a phase within the range of 270 to 360 degrees. Thus it can be seen that the range of possible phase values for a summed output signal is a function of the phase of the input signals, and the amplitude of the input signals. In this way amplitude scaling of the amplitude of two differential signals that are summed can be used to adjust the phase of the summed signal.

Summation circuit 220 of variable phase amplifier 152 according to the invention uses signal scaling a vector summing techniques. This concept is used in variable phase amplifier circuit 152 to adjust the phase of summed differential signal pair 158. The phase of the ends being summed determines the range of possible phase values for summed differential signal pair 156. The resulting phase and amplitude of summed differential signal pair 158 is adjusted by adjusting the amplitude of first scaled differential signal pair 174 and/or second scaled differential signal pair 176. For example, in this embodiment as shown in FIG. 11, the range of phase values available for summed differential signal pair first end 158a is between zero degrees (the phase of first scaled differential signal pair first end 174a) and 90 degrees (the phase of second scaled differential signal pair first end 176a). The particular phase and amplitude of summed differential signal pair first end 158a is adjusted by adjusting the amplitude of first scaled differential signal pair 174 and/or the amplitude of second scaled differential signal pair 176.

Similarly, in this embodiment as shown in FIG. 11, the range of phase values available for summed differential signal pair second end 158b is between 180 degrees (the phase of first scaled differential signal pair second end 174b) and 270 degrees (the phase of second scaled differential signal pair second end 176b). The particular phase and amplitude of summed differential signal pair second end 158a is adjusted by adjusting the amplitude of first scaled differential signal pair 174 and/or the amplitude of second scaled differential signal pair 176.

Figure 13:
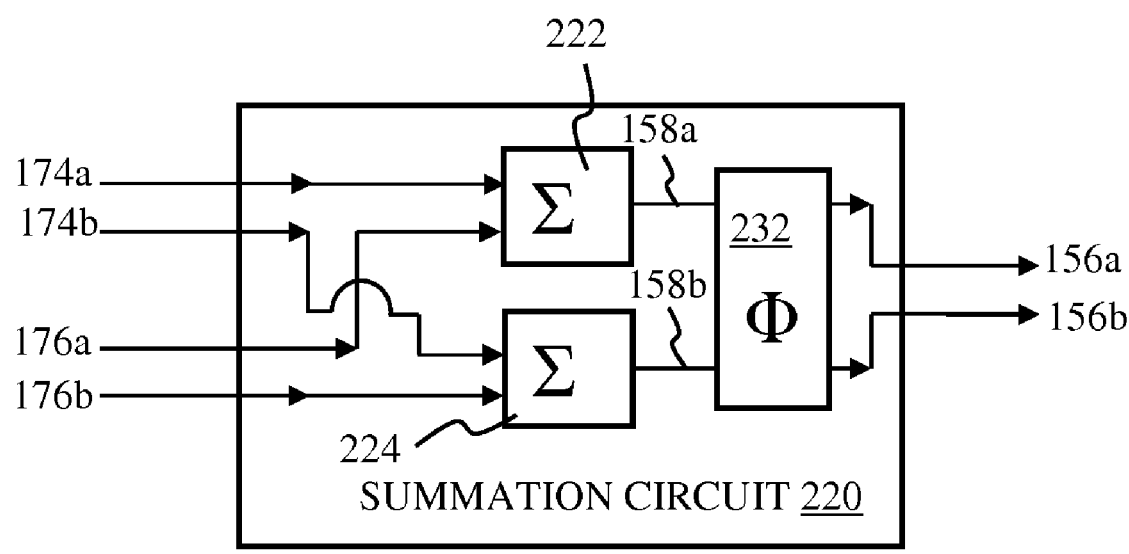
FIG. 13 shows another block diagram of one embodiment of summation circuit 220 of variable phase amplifier 152 according to the invention. Summation circuit 220 of FIG. 13 can be included in variable phase amplifier 152 of FIG. 4, FIG. 5, FIG. 6, FIG. 7, or FIG. 9.

In some embodiments of device 201 and variable gain amplifier 152, it is desirable to be able to shift the phase of summed differential signal pair 156 with respect to input differential signal pair 154 by a phase outside the range of the two signals being summed at summation stages 222 and 224. This can be accommodated by adding a fixed phase shift stage to summation circuit 220. FIG. 13 shows an embodiment of summation circuit 220 according to the invention which includes fixed phase shift stage 232. Fixed phase shift stage 232 adjusts the phase of the output of summation stages 222 and 224 by a fixed number of degrees. Fixed phase shift stage 232 receives summed differential signal pair 158 from first and second summation stages 222 and 224, shifts the phase of each end by a fixed number of degrees, and outputs modified differential signal pair 156. For example, if summation stage 222 and 224 output summed differential signal pair 158 which can be shifted with respect to input differential signal pair by zero to 90 degrees, and if fixed phase shift stage 232 is designed to provide a fixed phase shift of +10 degrees, then modified differential signal pair 156 will be adjustable in phase difference from input differential signal pair 154 by 10 (zero degrees plus 10 degrees) to 100 (90 degrees plus 10 degrees) degrees, having had 10 degrees added to each end of the range.

FIG. 13 illustrates an embodiment of summation circuit 220 where each end 158a and 158b of summed differential signal pair 158 are shifted by the same fixed number of degrees. In some embodiments two or more fixed phase shift stages are used, one or more for each end to be shifted. In some embodiments summed differential signal pair first end 158a is shifted by a first fixed number of degrees, and second summed differential signal pair second end 158b is shifted by a second fixed number of degrees. The first and the second fixed number of degrees can be any number of degrees.

The various embodiments of components of variable phase amplifier 152 as described can be used in many different combination to create embodiments of device 201 and variable phase amplifier circuits 152, where variable phase amplifier 152 receives input differential signal pair 154 from differential resonator 150, outputs modified differential signal 156, where modified differential signal pair 156 has a phase that varies over a range of degrees as compared to input differential signal pair 154, and provides modified differential signal pair 156 to resonator 150. The variable phase shift induced in modified differential signal pair 156 can be used to tune the resonating frequency of resonator 150.

Figure 14:
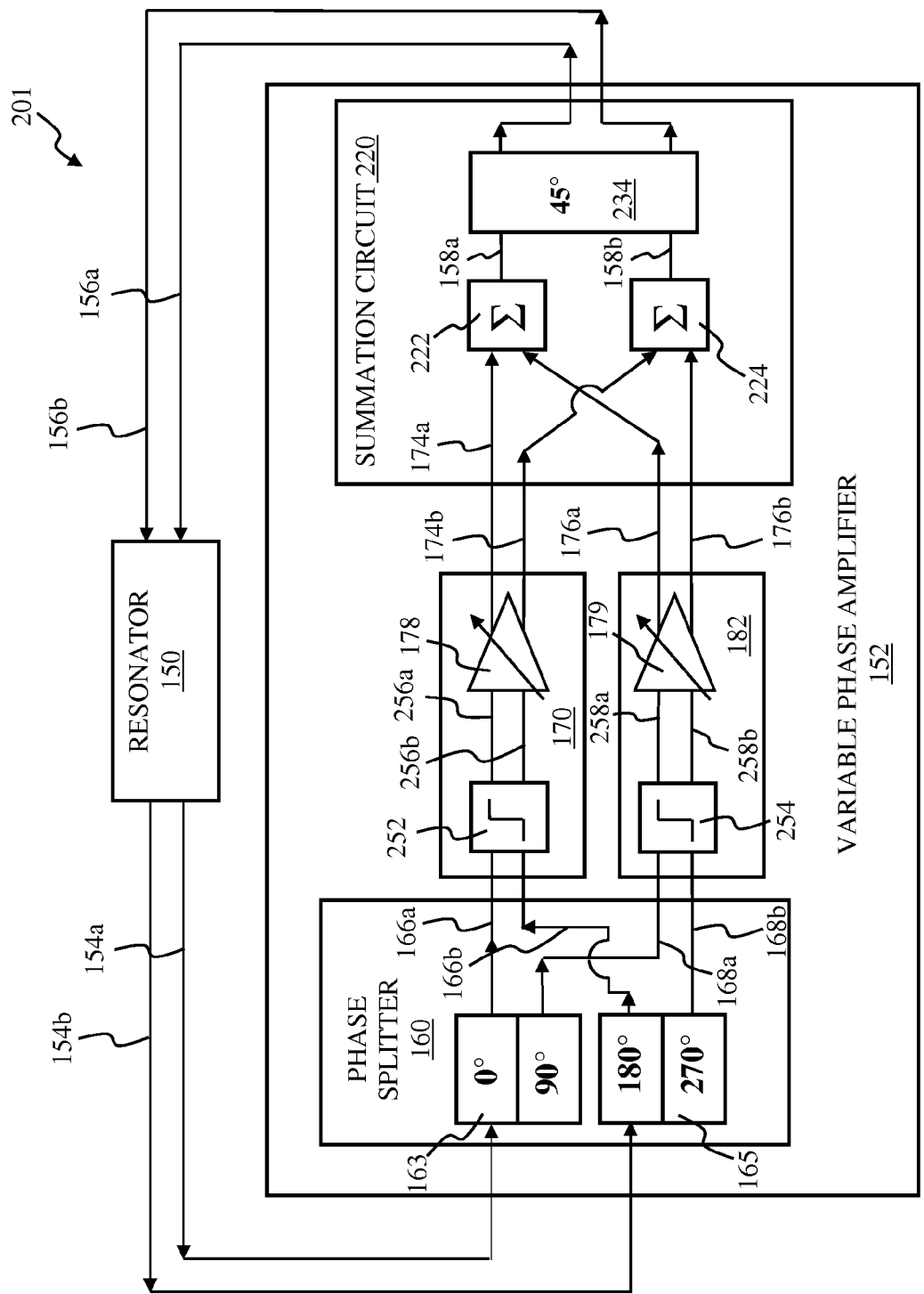
FIG. 14 shows an additional block diagram of device 201 according to the invention, including resonator 150 and variable phase amplifier 152.

FIG. 14 and FIG. 15 show a specific embodiment of device 201 including resonator 150 and variable phase amplifier 152. FIG. 14 shows a block diagram of device 201 including resonator 150 and variable phase amplifier 152. FIG. 15 shows an example circuit schematic of variable phase amplifier 152 as shown in FIG. 14. In this embodiment phase splitter 160 includes first phase shift stage 163 and second phase shift stage 165 as shown in FIG. 7 and FIG. 8. In this embodiment input differential signal pair first end 154a, which is output from phase splitter 160 as first input differential signal pair first end 166a, has a phase of zero degrees, and input differential signal pair second end 154b, which is output from phase splitter 160 as first differential signal pair second end 166b, has a phase of 180 degrees. Thus second end 154b of input differential signal pair 154 is shifted in phase from first end 154a of input differential signal pair 154 by 180 degrees. And in this way second end 166b of first differential signal pair 166 is shifted in phase from first end 166a of first differential signal pair 166 by 180 degrees.

Second differential signal pair 168 is split from input differential signal pair 166 such that it is 90 degrees out of phase with respect to first differential signal pair. In this embodiment second differential signal pair first end 168a has a phase of 90 degrees, and second differential signal pair second end 168*b* has a phase of 270 degrees. Thus second differential signal pair first end 168*a* has a phase that is shifted 90 degrees with respect to first differential signal pair first end 166*a*. And thus second differential signal pair second end 168*b* has a phase that is shifted 180 degrees with respect to second differential signal pair first end 168*a*.

In the embodiment of variable phase amplifier 152 of device 201 according to the invention as shown in FIG. 14 and FIG. 15, first and second variable phase amplifiers 170 and 182 receive first and second differential signal pairs 166 and 168 and apply first and second scale factors respectively, as explained with respect to FIG. 9 and FIG. 10. The first and second scale factors are adjustable, and therefore the amplitude of first and second scaled differential signal pairs 174 and 176 are adjustable with respect to each other, as explained earlier with respect to FIG. 9 and FIG. 10. First variable gain amplifier 170 includes transistors Q1 and Q2 and variable current source 196, as shown and described in FIG. 10. Second variable gain amplifier includes transistors Q3 and Q4, and variable current source 293.

In this embodiment, first and second scaled differential signal pair 174 and 176 do not have common mode signal or voltage offset variations induced in them, due to first and second variable gain amplifiers 170 and 182 receiving first and second differential signal pairs 166 and 168 that are true differential signal pairs, with their first and second ends 180 degrees out of phase from each other. In this embodiment first variable gain amplifier 170 receives first differential signal pair 166, where the two ends of first differential signal 166 pair are 180 degrees out of phase with respect to each other. Transistor Q1 receives first differential signal pair first end 166*a*, and transistor Q2 receives first differential signal pair second end 166*b*, where first end 166*a* is 180 degrees out of phase from second end 166*b*. Second variable gain amplifier 182 receives second differential signal pair 168, where the two ends of second differential signal pair 168 are 180 degrees out of phase with respect to each other. Transistor Q3 receives second differential signal pair first end 168*a*, and transistor Q4 receives second differential signal pair second end 168*b*, where first end 168*a* is 180 degrees out of phase from second end 168*b*.

It is advantageous for several reasons to have first and second variable gain amplifiers 170 and 182 receive the two ends of a signal that are 180 degrees out of phase. For one, when variable gain amplifier 170 and variable gain amplifier 182 receive signals that are 180 degrees out of phase with each other, no common mode signal is introduced into modified differential signal pair 156. Common mode signal is generated by each emitter coupled pair, but each common mode signal is applied to separate emitter-coupled pairs. Consequently, the common mode signals generated have no negative effect. This would not be the case if, for example, first differential signal pair 166 second end 166*b* was 90 degrees out of phase with respect to first differential signal pair first end 166*a*. Or if second differential signal pair 168*b* was 90 degrees out of phase with second differential signal pair 168*a*. In this example common mode signal would be generated that could show up in first or second scaled differential signal pairs 174 or 176, and ultimately could end up as phase instability of modified differential signal pair 156. It is undesirable to have common mode signal show up in first scaled differential signal pair 174 or second scaled differential signal pair 176, and so it is desirable to present variable gain amplifier circuits 170 and 182 with an input signal where the two ends are 180 degrees out of phase. Presenting first or second variable gain amplifier circuits 170 and 182 with a differential signal pair where the two ends are out of phase by 180 degrees maximizes the signal stability of modified differential signal pair 156, and provides accurate resonance frequency tuning capability when variable phase amplifier 152 is used to tune mechanical resonator 150.

Another advantage of providing a true differential signals to first variable gain amplifier 170 and second variable gain amplifier 182 is that this avoids an input voltage offset resulting from tuning dependent base currents being drawn through an asymmetric phase splitting network. Phase splitter 160 of FIG. 9 and as shown in schematic form in FIG. 8 is symmetric when the input and output ends of the differential signals received and generated are 180 degrees out of phase. If the ends of the signals are out of phase by a number of degrees different than 180, then voltage differences can be introduced into first differential signal pair 166, which will then be amplified by first variable gain amplifier 170 or second variable gain amplifier 182, and will show up as voltage offset noise in first scaled differential signal pair 174 and/or second scaled differential signal pair 176. This again will affect the accuracy and stability of modified differential signal 156 and the resonance tuning capability of variable phase amplifier 152 when it is used to tune a mechanical resonator Therefore it is advantageous to present first and second variable phase amplifiers 170 and 182 of with first and second differential signal pairs 166 and 168 where the two ends are 180 degrees out of phase with each other. This results in accurate and stable phase shifting of modified differential signal pair 156, which further allows accurate and stable adjustment of the frequency of oscillation of resonator 150.

Summation circuit 220 in the embodiment of FIG. 14 and FIG. 15 includes first summation stage 222 and 224 as described with respect to FIG. 11, and fixed phase shift stage 234 as discussed with respect to FIG. 13, where fixed phase shift stage 234 in this embodiment shifts the phase of summed differential signal pair 158 by 45 degrees.

In the embodiment shown in FIG. 14, first summation stage 222 receives first scaled differential signal pair first end 174*a*, which has a zero degree phase, and second scaled differential signal pair first end 176*a*, which has a phase of 90 degrees. Therefore summed differential signal pair first end 158*a* will have a phase that is between zero and 90 degrees, depending on the relative amplitudes of first scaled differential signal pair first end 174*a* and second scaled differential signal pair first end 176*a*, as explained earlier with regard to vector signal addition shown in FIG. 12. When the amplitude of second scaled differential signal pair first end 176*a* is adjusted to be zero (by adjusting the second scale factor to be zero), summed differential signal pair first end 158*a* will have a zero degree phase, and the amplitude will be that of first scaled differential signal pair first end 174*a*. When the amplitude of first scaled differential signal pair first end 174*a* is adjusted to zero (by adjusting the first scale factor to be zero), summed differential signal pair first end 158*a* will have a 90 degree phase, and the amplitude will be that of second scaled differential signal pair second end 176*a*. Summed differential signal pair first end 158*a* can be made to have any phase between zero and 90 degrees based on the relative amplitudes of first scaled differential signal pair first end 174*a* and second scaled differential signal pair first end 176*a*. In this way the phase of summed differential signal pair first end 158*a* is a function of the first and second scale factors. The phase of summed differential signal first end 158*a* can be adjusted within its range of possible phase values by adjusting the first and second scale factors.

Similarly, the phase of summed differential signal pair second end 158*b* can be made to have any phase between 180 and 270 degrees, based on the relative magnitudes of first scaled differential signal pair second end 174b and second scaled differential signal pair second end 176b. The phase of summed differential signal pair second end 158b is a function of the first and second scale factors. The phase of summed differential signal second end 158b can be adjusted within its range of possible phase values by adjusting the first and second scale factors.

In this embodiment the relative amplitudes of first scaled differential signal pair 174 and second scaled differential signal pair 176 are adjusted by adjusting the first and second scale factor of first and second variable gain amplifiers 170 and 182. Therefore in this specific embodiment, the phase of summed differential signal pair 158 is adjusted within a 90 degree range by adjusting the first and the second scale factors. Summed differential signal pair first end 158a is adjusted in phase from zero to 90 degrees as the first scale factor of first variable gain amplifier 170 is adjusted from a maximum value to zero, while the second scale factor of second variable gain amplifier 182 is simultaneously adjusted from zero to a maximum value. Summed differential signal pair second end 158b is adjusted in phase from 180 to 270 degrees as the first scale factor of first variable gain amplifier 170 is adjusted from a maximum value to zero, while the second scale factor of second variable gain amplifier 182 is simultaneously adjusted from zero to a maximum value.

In this way, summed differential signal pair first end 158a can be adjusted in phase between zero and 90 degrees by adjusting the first and second scale factors of first and second variable gain amplifiers 170 and 182. And in this way summed differential signal pair second end 158b can be adjusted in phase between 180 and 270 degrees by adjusting the first and second scale factors.

In this example the adjustable phase range of summed differential signal pair 158a is a range of zero to 90 degrees. It can be seen that the adjustable phase range can be changed by summing different ends of first and second scaled differential signal pairs 174 and 176, and/or by generating first and second differential signal pairs 166 and 168 with different phases. For example, if first summation stage 222 summed second end 174b of first scaled differential signal pair 174, and first end 176a of second scaled differential signal pair 176, summed differential signal pair first end 158a will have a phase range that is adjustable between 90 and 180 degrees, with the exact phase depending on how the first and second scale factors are adjusted. Thus in some embodiments the phase of scaled differential signal pair 174 and 176 is different than zero and 90 degrees as shown here. It can be readily seen that the adjustable range of summed differential signal pair 158a can be any range within the zero to 360 degree range, by choice of the phase of the input differential signal 154, the amount of phase shift introduced into second differential signal pair 168 with respect to first differential signal pair 166, and the choice of which ends of first and second scaled differential signal pairs 174 and 176 are summed by summation stages 222 and 224. In this way variable gain amplifier 152 can provide a summed differential signal pair 158 with an adjustable phase range, where the phase range is adjusted by adjusting the first or the second scale factors.

With regard to the embodiment shown in FIG. 14 and FIG. 15, fixed phase shift stage 234 receives summed differential signal pair 158, and shifts the phase of first end 158a and 158b by a fixed number of degrees, which in this embodiments is 45 degrees. After fixed phase shift stage 234 adjusts the phase of summed differential signal 158 by 45 degrees, adjusting the first and second scale factors allows an adjustment of the phase of modified differential signal pair 156 with respect to input differential signal pair within a 90 degree range which varies from 45 degrees to 135 degrees (zero degrees plus 45 degrees, to 90 degrees plus 45 degrees). This means that modified differential signal pair first end 156a can be adjusted in phase with respect to input differential signal pair first end 154a within a range from 45 to 135 degrees. Modified differential signal pair second end 156b can be adjusted in phase with respect to input differential signal pair second end 154b within a range from 225 to 315 degrees (45 degrees plus 180 degrees, to 135 degrees plus 180 degrees). Modified differential signal pair 156 can be used to adjust the operating frequency of resonator 150. Resonator 150 can be tuned with increased accuracy and stability due to the accuracy with which modified differential signal pair 156 can be adjusted in phase. Resonator 150 can be tuned with accuracy and stability due to the high signal quality provided by variable phase amplifier 152.

FIG. 15 shows a schematic diagram of an embodiment of variable phase amplifier 152 of FIG. 14. Transistors Q1 and Q2 and variable current source 196 make up variable gain amplifier circuit 170 as discussed earlier. Similarly transistors Q3 and Q4 and adjustable current source 293 make up variable gain amplifier circuit 182. In this embodiment variable gain amplifiers 170 and 182 are implemented as variable transconductance amplifiers, such that first scaled differential signal pair 174 and second scaled differential signal pair 176 are converted into current signals at the collectors of Q1 and Q2 (first scaled differential signal pair 174) and Q3 and Q4 (second scaled differential signal pair 174). Conversion to a current signal simplifies summing of the differential signal pairs. In this embodiment first scaled differential signal pair 174a is summed to second scaled differential signal pair 176a, and so in this embodiment transistor Q1 and transistor Q3 collectors share a connection to R1. Similarly, transistor Q2 and transistor Q4 collectors share a connection to resistor R2, which enable summing of first scaled differential signal pair second end 174b and second scaled differential signal pair second end 176b.

Capacitor C1 is fixed phase shift stage 234. Summation stage 222 occurs at Q1 collector 282, and includes resistor R1. At Q1 collector 282, first scaled differential signal pair first end 174a is summed with second scale differential pair first end 176a, and capacitor C1 provides a fixed 45 degree phase shift, outputting modified differential signal pair first end 156a at node 295 as shown.

Summation stage 224 occurs at Q2 collector 286 and includes resistor R2. At Q2 collector 286 first scaled differential signal pair second end 174b is summed with second scale differential pair second end 176b, and capacitor C1 provides a fixed 45 degree phase shift, outputting modified differential signal pair second end 156b at node 294 as shown.

In this way variable phase amplifier 152 receives input differential signal pair 154, and outputs modified differential signal pair 156 in response. Modified differential signal pair 156 can be phase shifted a variable number of degrees with respect to input differential signal pair 154. The amount of phase shift induced in modified differential signal pair 156 is a function of the first and second scale factors, the phase of input differential signal pair first and second ends 154a and 154b, and the phase of the first and second differential signal pairs 166 and 168 generated by phase splitter circuit 160. In some embodiments the phase of modified differential signal pair 156 is adjusted by adjusting the first scale factor. In some embodiments the phase of modified differential signal pair 156 is adjusted by adjusting the second scale factor. In some embodiments the phase of modified differential signal pair 156 is adjusted by adjusting the first and the second scale factors. Modified differential signal pair 156 is provided to resonator 150. The oscillating frequency of resonator 150 is a function of the phase of modified differential signal pair 156. Therefore the oscillating frequency of resonator 150 is a function of the phase of modified differential signal pair 156. Therefore the oscillating frequency of resonator 150 is a function of the first and second scale factors in some embodiments. In some embodiments the oscillating frequency of resonator 150 is a function of the phase of input differential signal pair first and second ends 154a and 154b, and/or the phase of the first and second differential signal pairs 166 and 168 generated by phase splitter circuit 160. The oscillating frequency of resonator 150 is adjusted by adjusting the first scale factor. The oscillating frequency of resonator 150 is adjusted by adjusting the second scale factor. The oscillating frequency of resonator 150 is adjusted by adjusting the phase of modified differential signal pair 156.

It is to be understood that variable phase amplifier 152 as shown in the specific block diagram and schematic implementation of FIG. 14 and FIG. 15 is one example of variable gain amplifier 152, and that many other possible schematic implementations are possible. Variable gain amplifier 152 can be designed to use different components, discrete or integrated, different types of transistors, and different schematic elements, as is known in the art now or in the future.

FIG. 16 shows an addition embodiment of variable gain amplifier 152, which includes buffer circuit 298 which buffers modified differential signal pair 156, outputting buffered modified differential signal pair 198. Variable gain amplifier 152 as shown in FIG. 16 also includes adjustable current source 296, which includes adjustable current sources 196 and 293 of FIG. 15. Adjustable current source 196 includes transistors Q5 and Q7. Adjustable current source 196 receives linearly adjustable current signal 197a, which can be used to adjust the first scale factor. Adjusting the current level of linearly adjustable current signal 197a adjusts the first scale factor. Similarly, adjustable current source 293 includes transistors Q6 and Q8, and receives linearly adjustable current signal 197b, which can be used to adjust the second scale factor. Adjusting the current level of linearly adjustable current signal 197b adjusts the second scale factor.

Specific block diagrams and schematic embodiments of variable phase amplifier 152 and device 201 including variable phase amplifier 152 have been shown. These are example embodiments of device 201 and variable phase amplifier 152. Many other embodiments are possible which embody the invention as described by the claims.

Figure 17:
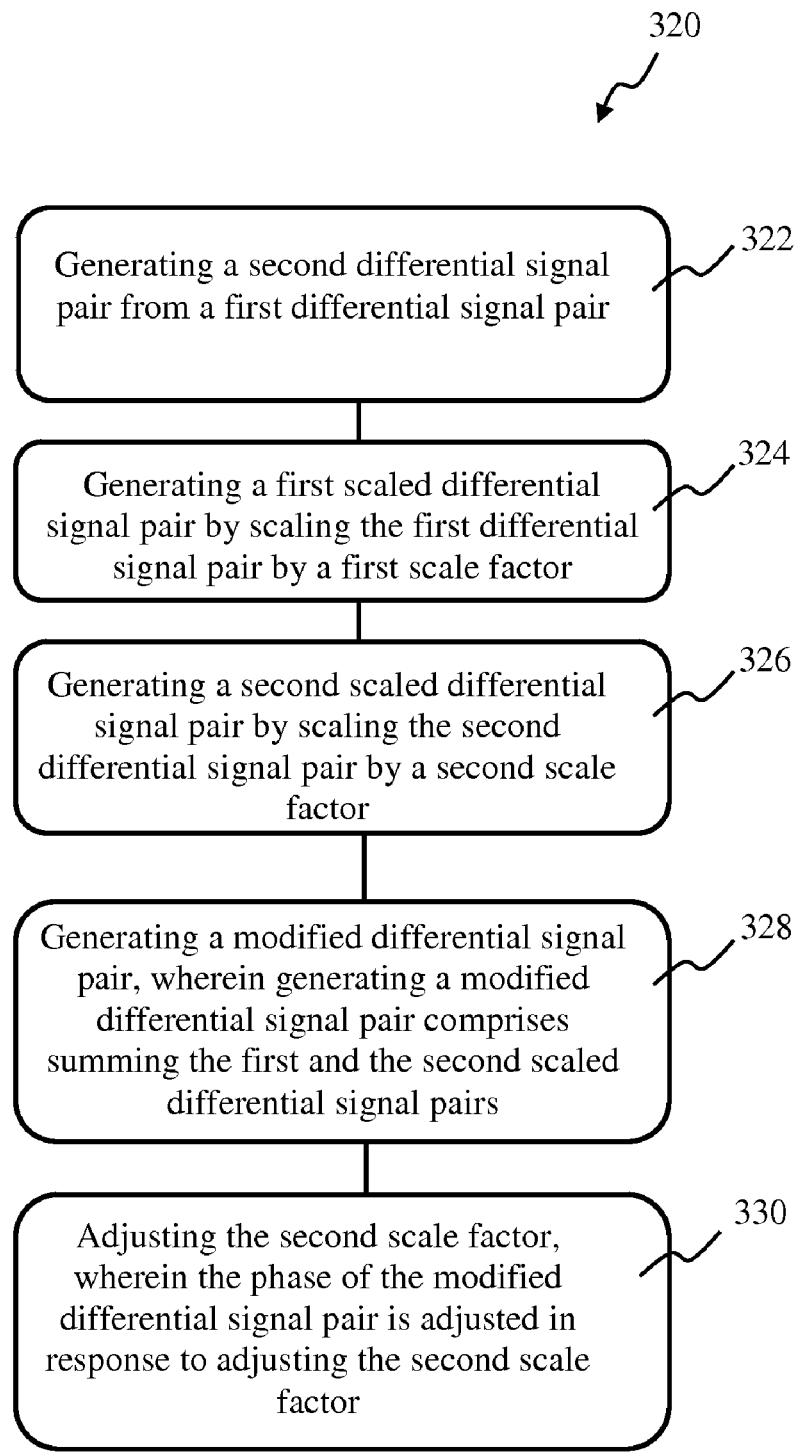
FIG. 17 illustrates method 320 of adjusting the phase of a differential signal pair according to the invention.

FIG. 17 shows method 320 of adjusting a phase of a differential signal pair, wherein method 320 includes step 322, generating a second differential signal pair from a first differential signal pair, and step 324, generating a first scaled differential signal pair by scaling the first differential signal pair by a first scale factor. Method 320 also includes step 326, generating a second scaled differential signal pair by scaling the second differential signal pair by a second scale factor, and step 328 generating a modified differential signal pair, wherein generating a modified differential signal pair comprises summing the first and the second scaled differential signal pairs. Method 320 also includes step 330, adjusting the second scale factor, wherein the phase of the modified differential signal pair is adjusted in response to adjusting the second scale factor. Method 320 can include many other steps. In some embodiments method 320 includes the step of adjusting the first scale factor, wherein the phase of the modified differential signal pair is adjusted in response to adjusting the first scale factor. In some embodiments adjusting the first scale factor includes adjusting the scale factor of a first variable gain amplifier. In some embodiments adjusting the first scale factor adjusts the amplitude of a first scaled differential signal pair. In some embodiments adjusting the first scale factor adjusts the phase of a summed differential signal pair. In some embodiments adjusting the first scale factor adjusts the phase of the modified differential signal pair. In some embodiment method 320 include adjusting both the first and the second scale factor. In some embodiment method 320 includes limiting the amplitude of the first and the second differential signal pairs.

Step 322 generating a second differential signal pair from a first differential signal pair involves generating a first and a second differential signal pair from a first differential signal pair. In some embodiment step 322 includes phase splitting the first differential signal pair into the first and the second differential signal pair. In some embodiments the second differential signal pair is generated from the first differential signal pair using other means or methods. In some embodiments the second differential signal pair has a phase that is shifted with respect to the first differential signal pair. In some embodiments the second differential signal pair has a phase that is shifted 90 degrees with respect to the first differential signal pair. In some embodiments the first differential signal pair second end has a phase that is shifted 180 degrees with respect to the first differential signal pair first end. In some embodiments the second differential signal pair second end has a phase that is shifted 180 degrees with respect to the second differential signal pair first end.

Step 324 generating a first scaled differential signal pair by scaling the first differential signal pair by a first scale factor can include any steps which result in scaling the amplitude of the first differential signal pair by a first scale factor. In some embodiment step 324 includes adjusting a first scale factor of a first variable gain amplifier. In some embodiments the first variable gain amplifier is a limiting amplifier, which limits the amplitude of the first scaled differential signal pair. In some embodiments the first differential signal pair is scaled by a first scale factor using other means and/or methods. The first scale factor can be any value. In some embodiments the first scale factor ranges from zero degrees to a maximum first scale factor value. In some embodiments the maximum first scale factor value is about 2. In some embodiments the maximum first scale factor value is different than 2. Step 324 can include many other steps.

Step 326 generating a second scaled differential signal pair by scaling the second differential signal pair by a second scale factor can include any steps which result in scaling the amplitude of the second differential signal pair by a second scale factor. In some embodiment step 326 includes adjusting a second scale factor of a second variable gain amplifier. In some embodiments the second variable gain amplifier is a limiting amplifier, which limits the amplitude of the second scaled differential signal pair. In some embodiments the second differential signal pair is scaled by a second scale factor using other means and/or methods. The second scale factor can be any value. In some embodiments the second scale factor ranges from zero degrees to a maximum second scale factor value. In some embodiments the maximum second scale factor value is about 2. In some embodiments the maximum second scale factor value is different than 2. Step 326 can include many other steps.

In some embodiments the first and the second scale factors are adjusted separately. In some embodiments the first and the second scale factors are adjusted to be the same value. In some embodiments the first and the second scale factors are adjusted to be different values.

Step 328 generating a modified differential signal pair, wherein generating a modified differential signal pair comprises summing the first and the second scaled differential signal pairs, can include many other steps. In some embodiments step 328 includes summing a first end of a first scaled differential signal pair and a first end of a second scaled differential signal pair. In some embodiments step 328 includes summing a second end of a first scaled differential signal pair and a second end of a second scaled differential signal pair. In some embodiments step 328 includes summing a first end of a first scaled differential signal pair and a second end of a second scaled differential signal pair. In some embodiments step 328 includes summing a second end of a first scaled differential signal pair and a first end of a second scaled differential signal pair. In some embodiments the first and the second scaled differential signal pairs are summed in a different way.

Step 330 adjusting the second scale factor, wherein the phase of the modified differential signal pair is adjusted in response to adjusting the second scale factor, can include many other steps. In some embodiments adjusting the second scale factor includes adjusting the scale factor of a second variable gain amplifier. In some embodiments adjusting the second scale factor adjusts the amplitude of a second differential signal pair. In some embodiments adjusting the second scale factor adjusts the phase of a summed differential signal pair. In some embodiments adjusting the second scale factor adjusts the phase of the modified differential signal pair.

In some embodiments the first and the second scale factors are adjusted separately. In some embodiments the first and the second scale factors are adjusted to be the same value. In some embodiments the first and the second scale factors are adjusted to be different values.

Figure 18:
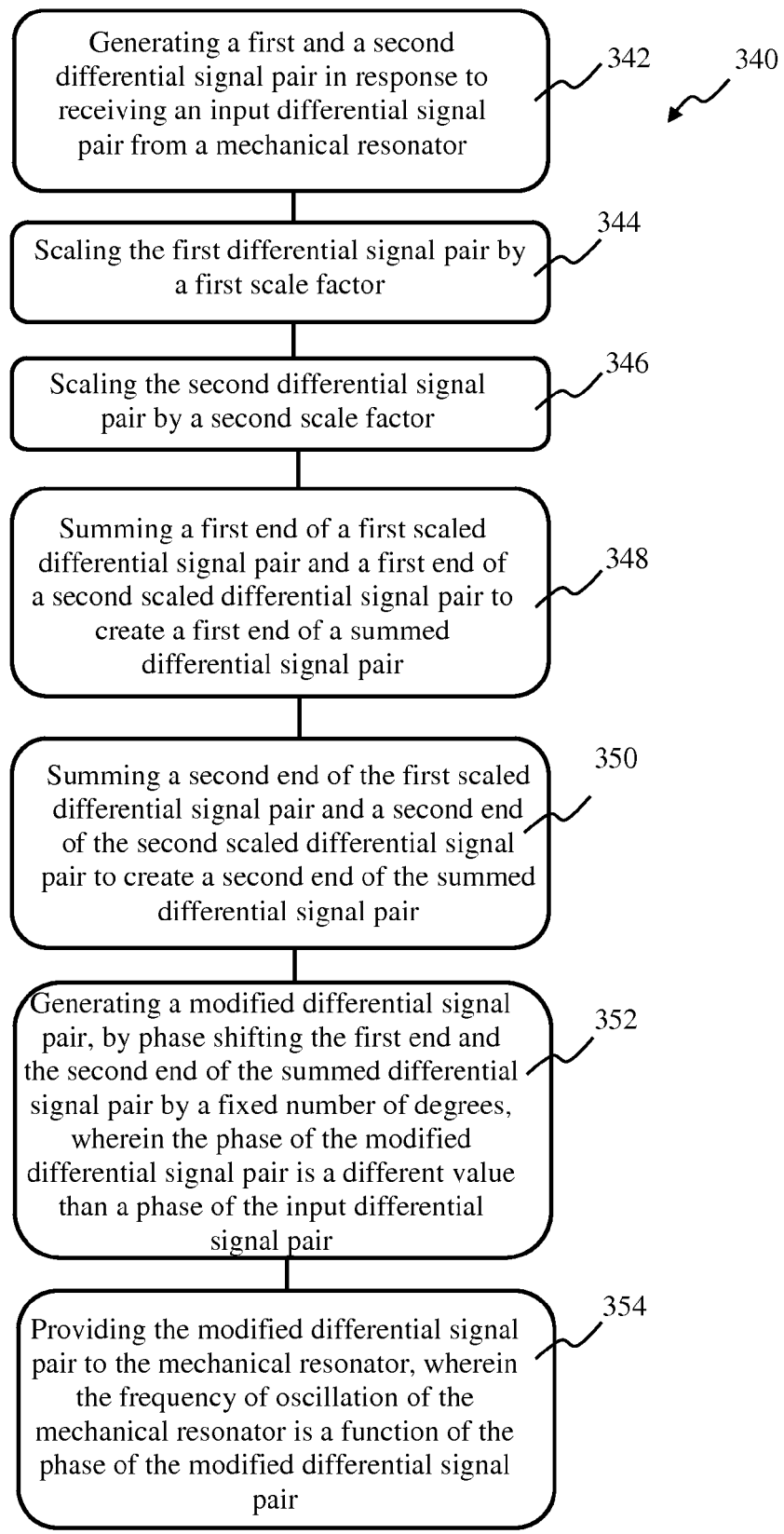
FIG. 18 illustrates method 340 of adjusting the frequency of oscillation of a mechanical resonator according to the invention.

FIG. 18 illustrates method 340 of adjusting the frequency of oscillation of a mechanical resonator according to the invention. Method 240 includes step 342 generating a first and a second differential signal pair in response to receiving an input differential signal pair from a mechanical resonator. Method 340 also includes steps 344, generating a first scaled differential signal pair, wherein generating a first scaled differential signal pair comprises scaling the first differential signal pair by a first scale factor, and step 346, generating a second scaled differential signal pair, wherein generating a second scaled differential signal pair comprises scaling the second differential signal pair by a second scale factor. Method 340 according to the invention includes step 348 summing a first end of the first scaled differential signal pair and a first end of the second scaled differential signal pair to create a first end of a summed differential signal pair, and step 350 summing a second end of the first scaled differential signal pair and a second end of the second scaled differential signal pair to create a second end of the summed differential signal pair. Method 340 includes step 352 generating a modified differential signal pair, wherein generating a modified differential signal pair comprises phase shifting the first end and the second end of the summed differential signal pair by a fixed number of degrees, wherein the phase of the modified differential signal pair is a different value than the phase of the input differential signal pair. Method 340 also includes step 354 providing the modified differential signal pair as input to the mechanical resonator, wherein the frequency of oscillation of the mechanical resonator is a function of the phase of the modified differential signal pair.

Method 340 can include many other steps. In some embodiments method 340 includes limiting the amplitude of the first differential signal pair. In some embodiments method 340 includes limiting the amplitude of the second differential signal pair. In some embodiments method 340 includes adjusting the first scale factor, where the frequency of oscillation of the mechanical resonator is adjusted in response to adjusting the first scale factor. In some embodiments of method 340 the amplitude of the first scaled differential signal pair is adjusted in response to adjusting the first scale factor. In some embodiments of method 340 the phase of the summed differential signal pair is adjusted in response to adjusting the first scale factor.

In some embodiments method 340 includes adjusting the second scale factor, where the frequency of oscillation of the mechanical resonator is adjusted in response to adjusting the second scale factor. In some embodiments of method 340 the amplitude of the second scaled differential signal pair is adjusted in response to adjusting the second scale factor. In some embodiments of method 340 the phase of the summed differential signal pair is adjusted in response to adjusting the second scale factor.

In some embodiments the first and the second scale factors are adjusted separately. In some embodiments the first and the second scale factors are adjusted to be the same value. In some embodiments the first and the second scale factors are adjusted to be different values.

Step 342 generating a first and a second differential signal pair in response to receiving an input differential signal pair from a mechanical resonator can include many other steps. In some embodiments step 342 includes phase splitting the second differential signal pair from the input differential signal pair. In some embodiments step 342 includes phase splitting the first differential signal pair from the input differential signal pair. In some embodiments the first differential signal pair is the input differential signal pair. In some embodiments the second differential signal pair is the input differential signal pair. In some embodiments the second differential signal pair is phase split from the input differential signal pair such that the second differential signal pair has a phase that is shifted 90 degrees with respect to the input differential signal pair. In some embodiments the second differential signal pair is phase split from the input differential signal pair such that the second differential signal pair has a phase that is shifted 90 degrees with respect to the first differential signal pair. In some embodiments the second differential signal pair is phase split from the input differential signal pair such that the second differential signal pair has a phase that is shifted a number of degrees with respect to the input differential signal pair. In some embodiments the second differential signal pair is phase split from the input differential signal pair such that the second differential signal pair has a phase that is shifted a number of degrees with respect to the first differential signal pair.

Step 344 generating a first scaled differential signal pair, wherein generating a first scaled differential signal pair comprises scaling the first differential signal pair by a first scale factor, can include many other steps. Step 344 generating a first scaled differential signal pair by scaling the first differential signal pair by a first scale factor can include any steps which result in scaling the amplitude of the first differential signal pair by a first scale factor. In some embodiment step 344 includes adjusting a first scale factor of a first variable gain amplifier. In some embodiments the first variable gain amplifier is a limiting amplifier, which limits the amplitude of the first scaled differential signal pair. In some embodiments the first differential signal pair is scaled by a first scale factor using other means and/or methods. The first scale factor can be any value. In some embodiments the first scale factor ranges from zero degrees to a maximum first scale factor value. In some embodiments the maximum first scale factor value is about 2. In some embodiments the maximum first scale factor value is different than 2.

Step 346 generating a second scaled differential signal pair, wherein generating a second scaled differential signal pair comprises scaling the second differential signal pair by a second scale factor, can include many other steps. Step 346 generating a second scaled differential signal pair by scaling the second differential signal pair by a second scale factor can include any steps which result in scaling the amplitude of the second differential signal pair by a second scale factor. In some embodiment step 346 includes adjusting a second scale factor of a second variable gain amplifier. In some embodiments the second variable gain amplifier is a limiting amplifier, which limits the amplitude of the second scaled differential signal pair. In some embodiments the second differential signal pair is scaled by a second scale factor using other means and/or methods. The second scale factor can be any value. In some embodiments the second scale factor ranges from zero degrees to a maximum second scale factor value. In some embodiments the maximum second scale factor value is about 2. In some embodiments the maximum second scale factor value is different than 2.

Step 348 summing together a first end of the first scaled differential signal pair and a first end of the second scaled differential signal pair to create a first end of a summed differential signal pair involves using any means, methods, or device which will add the first end of the first scaled differential signal pair and the first end of the second scaled differential signal pair together to create the first end of the summed differential signal pair. In some embodiments the first scaled differential signal pair and the second scaled differential signal pair are converted to current and then their first ends are added together. In some embodiment other methods are used to sum the first end of the first scaled differential signal pair and the first end of the second scaled differential signal pair.

Step 350 summing together a second end of the first scaled differential signal pair and a second end of the second scaled differential signal pair to create a second end of a summed differential signal pair involves using any means, methods, or device which will add the second end of the first scaled differential signal pair and the second end of the second scaled differential signal pair together to create the second end of the summed differential signal pair. In some embodiments the first scaled differential signal pair and the second scaled differential signal pair are converted to current and then their second ends are added together. In some embodiment other methods are used to sum the second end of the first scaled differential signal pair and the second end of the second scaled differential signal pair.

Step 352 generating a modified differential signal pair, wherein generating a modified differential signal pair comprises phase shifting the first end and the second end of the summed differential signal pair by a fixed number of degrees, and wherein a phase of the modified differential signal pair is a different value than a phase of the input differential signal pair, can include using any device, method, or means by which both the first end and the second end of the summed differential signal pair is shifted by a fixed number of degrees. In some embodiments the first end and the second end are shifted by the same number of degrees. In some embodiments the first end and the second end are shifted by a different number of degrees. The phase of the modified differential signal pair will have a phase that is different than the phase of the input differential signal pair.

Step 354 providing the modified differential signal pair as input to the mechanical resonator, wherein the frequency of oscillation of the mechanical resonator is a function of the phase of the modified differential signal pair, includes feeding back the modified differential signal pair to the mechanical resonator which provided the input differential signal pair. The resonator will change its oscillating frequency when the modified differential signal pair has a phase that is different from the input differential signal pair. The oscillating frequency of the resonator can be adjusted by adjusting the phase of the modified differential signal pair. In some embodiments the phase of the modified differential signal pair is adjusted by adjusting the first scale factor. In some embodiments the phase of the modified differential signal pair is adjusted by adjusting the second scale factor. In some embodiment the phase of the modified differential signal pair is adjusted by other methods.

It has been shown how a variable phase amplifier can be used to generate a modified differential signal pair that has a phase that is shifted by some number of degrees with respect to an input differential signal pair. The number of degrees of phase shift introduced into the modified differential signal pair is adjustable. In some embodiments the number of degrees of phase shift introduced into the modified differential signal pair is adjustable by adjusting the amplitude of a first and a second scaled differential signal pair. The modified differential signal pair is fed back to a mechanical resonator that generated the input differential signal pair. The oscillating frequency of the mechanical resonator can be adjusted by adjusting the phase of the modified differential signal pair. The range of degrees of phase shift introduced into the modified differential signal pair can be designed to be a range within the zero to 360 degree total range. The range of degrees of phase shift introduced into the modified differential signal pair can be chosen to allow adjustment of the oscillating frequency of the mechanical resonator both above and below the natural resonant frequency of the mechanical resonator, as shown in FIG. 3. The variable phase amplifier described generates an accurate and stable phase shift in the modified differential signal pair, allowing the oscillating frequency of the resonator to be adjusted accurately and without phase shift drift.

It should be appreciated that some of the phase-shifting techniques described herein may enable variable phase-shifting to be achieved without the need for a variable capacitor, an inductor (of fixed or variable value), tunable diodes (also known as varactors), and/or variable resistors. As some of these components may complicate the design of integrated circuits (ICs), the avoidance of them may be beneficial, for example in those embodiments in which the circuits described herein are implemented as ICs. For instance, forming inductors in integrated circuits can be complicated and can lead to undesirable eddy currents in some configurations, such that it may be beneficial to have an IC phase-shifter that avoids the need for an inductor.

Those phase-shifting techniques described herein utilizing amplitude scaling of different amounts on different signals (e.g., different ends of a differential signal) may avoid any need for variable capacitors, variable resistors, inductors, and/or varactors. Thus, tunable oscillators having a variable phase shift may be achieved according to one or more of the aspects described herein without the need for tunable inductors, tunable resistors, tunable capacitors, varactors or tunable diodes. Accordingly, phase-shifted signals may be produced without the use of variable capacitors, variable resistors, inductors, and/or varactors.

As mentioned, one or more of the apparatus and techniques described above may provide accuracy and flexibility in tuning of a device. For example, according to some embodiments, the tuning range of a device (e.g., tuning range 308) may be approximately 700 parts-per-million (ppm) of the resonance frequency of the device and/or the mechanical resonator (which may be, for example, any of the resonance frequencies listed below, or any other suitable resonance frequency), may be at least 300 ppm of the resonance frequency, may be at least 400 ppm of the resonance frequency, may be at least 500 ppm of the resonance frequency, may be up to 1500 ppm of the resonance frequency, may range from 300-800 ppm of the resonance frequency (e.g., between approximately 400 and 600 ppm, between approximately 500 and 700 ppm, between approximately 600-800 ppm), may range from 5-200 ppm (e.g., between approximately 50-100 ppm), or may have other values. Also, as mentioned, the ability to adjust the resonance frequency of a device on both sides of a series resonance frequency of a mechanical resonator may relax design constraints on the mechanical resonator, since any deviation of the inherent resonance frequency of the mechanical resonator from a desired value may be compensated for by suitable tuning. Similarly, temperature-induced variations, package-induced variations, and/or material stress induced variations in the resonance frequency of the mechanical resonator may be compensated for using one or more of the techniques described above.

According to some embodiments, one or more of the circuits and methods described above may be implemented as a MEMS, a NEMS, or any other suitable device. However, it should be appreciated that the apparatus and methods described herein are not limited to use with MEMS, NEMS, or any other particular structures. As such, other configurations are also possible.

According to some embodiments, the mechanical resonators and/or devices described herein may be packaged. As a result, in some embodiments, the resonance frequency of the mechanical resonators and/or devices may be subject to package-induced stresses, and the tuning methods described herein may be used to compensate for such stresses.

According to some embodiments, the tuning methods described herein may be used in combination with other tuning methods, including but not limited to stress tuning, either by electrostatic techniques or piezoelectric techniques. Other types of tuning are also possible, as the various aspects described herein are not limited to being used as the sole type of tuning of a device.

As mentioned, the various aspects described herein including mechanical resonators are not limited to use with any particular type of mechanical resonator. It should be appreciated that the mechanical resonators (e.g., resonators 202 and 150) may be of any suitable type, as the various aspects of the technology are not limited in this respect. Thus, aspects of the technology may apply to devices having mechanical resonators of various materials/compositions, shapes, sizes, and/or methods of actuation and/or detection.

For example, the mechanical resonator may comprise or be formed of any suitable material(s) and may have any composition. According to some embodiments, the mechanical resonator may comprise or be formed of a piezoelectric material. According to some embodiments, the mechanical resonator comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonator comprises a piezoelectric material, the piezoelectric material may be single crystal material. According to some embodiments, the mechanical resonator may comprise a base on which additional structures (e.g., electrodes) are formed, and the base may comprise any of those materials listed, or any other suitable materials.

According to some embodiments, the mechanical resonator comprises or is formed of multiple layers, making the structure a composite structure. For example, a mechanical resonator may comprise a base on which electrodes are formed, thus making the structure a composite structure. In addition, or alternatively, the base itself may comprise one or more layers of differing materials, shapes, and/or thicknesses. For example, the base of the mechanical resonator may comprise an active layer and one or more insulating layers.

The mechanical resonator may have any shape. For example, aspects of the technology may apply to mechanical resonators that are substantially rectangular, substantially ring-shaped, substantially disc-shaped, or that have any other suitable shape. Moreover, the mechanical resonator may have one or more beveled edges. According to some embodiments, the mechanical resonator may be substantially planar.

The mechanical resonator may have any suitable dimensions. According to some embodiments, the mechanical resonator has a thickness T, which in some embodiments is less than approximately three wavelengths of a resonance frequency of interest of the mechanical resonator. According to some embodiments, the thickness is less than approximately two wavelengths of the resonance frequency of interest. In still other embodiments, the thickness may be less than approximately one wavelength of the resonance frequency of interest (e.g., less than approximately one wavelength of a resonant Lamb wave supported by the mechanical resonator). The thickness may determine or depend on the types of waves supported by the mechanical resonator. For example, a given thickness may limit the ability of the mechanical resonator to support Lamb waves, or certain modes of Lamb waves. Thus, it should be appreciated that the thickness may be chosen in dependence on the types and/or modes of waves desired to be supported by the mechanical resonator. It should also be appreciated that thickness values other than those listed may be suitable for some applications, and that the various aspects described herein are not limited to using mechanical resonators having any particular thickness values.

According to some embodiments, the mechanical resonator may have a large dimension (e.g., the largest of length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS).

The mechanical resonator may have any desired resonance frequencies and frequencies of operation, and may be configured to provide output signals of any desired frequencies. For example, the resonance frequencies and/or frequencies of operation of the mechanical resonators, and the frequencies of the output signals provided by the mechanical resonators, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the frequencies are not limiting.

The mechanical resonators may be actuated and/or detected in any suitable manner, with the particular type of actuation and/or detection depending on the type of mechanical resonator, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

It should be understood that the tuning methods described herein may be applied to devices having various types of mechanical resonators, including using quartz crystal resonators, bulk acoustic wave (BAW) resonators, surface acoustic wave (SAW) resonators, plate acoustic wave (PAW) resonators, (thin) film plate acoustic resonators (FPAR), film bulk acoustic resonators (FBAR), solid mounted resonators (SMR), contour mode resonators (CMR), thin-film piezoelectric on silicon (TPoS), microelectromechanical systems (MEMS) technology, or any other type of resonator technology that uses mechanical vibrations in a solid to excite a resonance frequency. It should be appreciated that as used herein the term "mechanical resonator" encompasses at least quartz crystal resonators, BAW, SAW, PAW, SMR, FPAR, FBAR, CMR, thin-film piezoelectric on silicon (TPoS) resonator technology, and MEMS resonators.

According to some embodiments, the devices described herein may be piezoelectric Lamb wave devices, such as piezoelectric Lamb wave resonators. Such Lamb wave devices may operate based on propagating acoustic waves, with the edges of the mechanical resonator serving as reflectors for the waves. For such devices, the spacing between the resonator edges may define the resonance cavity, and resonance may be achieved when the cavity is an integer multiple of p, where $p=\lambda/2$, with $\lambda$ being the acoustic wavelength of the Lamb wave. However, it should be appreciated that aspects of the technology described herein apply to other types of structures as well, and that Lamb wave structures are merely non-limiting examples.

In some embodiments including mechanical resonators, the mechanical resonators may be suspended, in that they may have one or more segments which are not directly attached to any other structures. It should be appreciated that various forms of "suspended" structures may be used, including, but not limited to, structures having any one or more free surfaces.

In some embodiments, mechanical resonators such as those described herein may include one or more electrodes, for example to actuate the mechanical resonator. In such embodiments, the mechanical resonator may have any suitable type, number, and configuration of electrodes. For example, the electrodes may be formed of any suitable material. Any number of electrodes may be included. For example, in some embodiments, one electrode is connected to each of an input port and an output port to drive and sense the operation of the mechanical resonator. In other embodiments, more than one electrode may be connected to each electrical port. In some embodiments, the electrodes are individual strips. However, the electrodes may take any suitable shape. The electrodes may extend along substantially the entire width W of a mechanical resonator, or may alternatively extend along only a part of the width (e.g., half the width, a quarter of the width, etc.). Other configurations are also possible, as the various structures herein including electrodes are not limited to any particular number, shapes, or configurations of electrodes, unless so stated.

It should be appreciated from the foregoing, that in some embodiments variable tuning functionality (e.g., variable frequency tuning functionality) may be provided with a circuit including phase shifters providing a fixed phase shift. In such instances, the variable tuning may be provided by applying variable gain to phase shifted signals as described. Thus, the design of the phase shifter may be simplified and may be implemented using conventional IC technology. According to other embodiments, fixed amplitude scaling may be provided and one or more variable phase shifters may be included in a tuning circuit. According to still other embodiments, a variable phase shifter and variable gain circuit may be employed to provide variable frequency tuning.

While some of the aspects and embodiments described above have been described as applying to circuits including mechanical resonators, not all aspects and embodiments are limited in this respect. Rather, the phase shifting circuitry and techniques described may be used to tune phased array antennas, or other devices in which phase shifting of signals is desired. Similarly, the techniques may be used for signal processing applications, for phase-shift encoding, for operation of radiation adaptive antennas, and in gyroscopes for phase matching and mode matching control. Thus, it should be appreciated that the applications described herein are provided for purposes of illustration and are not limiting.

One or more of the aspects and embodiments described herein may provide various beneficial operating characteristics for devices. For example, the tuning techniques described herein may allow for oscillators with very low phase noise. One or more of the oscillators described herein may have an unloaded Q factor less than approximately 8,000 and/or a loaded Q factor less than approximately 4,000. Other beneficial operating characteristics may also be realized.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above.

The invention claimed is:

1. A variable phase amplifier circuit comprising:
   a phase splitter circuit, wherein the phase splitter circuit generates a first and a second differential signal pair in response to receiving an input differential signal pair, and wherein:
      a phase of the second differential signal pair is shifted 90 degrees with respect to a phase of the first differential signal pair;
      a phase of a second end of the first differential signal pair is shifted 180 degrees with respect to a phase of a first end of the first differential signal pair;
      a phase of a second end of the second differential signal pair is shifted 180 degrees with respect to a phase of a first end of the second differential signal pair;
   a first variable gain amplifier circuit coupled to the phase splitter circuit, wherein the first variable gain amplifier circuit comprises:

a first transistor, wherein the first transistor comprises:
  a first transistor emitter node, wherein the first transistor emitter node is coupled to an adjustable current source; and
  a first transistor collector node, wherein the first transistor collector node is coupled to a supply voltage through a first resistor, and wherein the first transistor collector node outputs the first end of the first scaled differential signal pair in response to the first transistor base node receiving the first end of the first differential signal pair; and
a second transistor, wherein the second transistor comprises:
  a second transistor emitter node, wherein the second transistor emitter node is coupled to the first transistor emitter node; and
  a second transistor collector node, wherein the second transistor collector node is coupled to the supply voltage through a second resistor, and wherein the second transistor collector node outputs the second end of the first scaled differential signal pair in response to the second transistor base node receiving the second end of the first differential signal pair;
wherein the first variable gain amplifier circuit scales the first differential signal pair by a first scale factor in response to receiving the first differential signal pair;
a second variable gain amplifier circuit coupled to the phase splitter circuit, wherein the second variable gain amplifier circuit scales the second differential signal pair by a second scale factor in response to receiving the second differential signal pair; and
a summation circuit coupled to the first and the second variable gain amplifier circuits, wherein the summation circuit receives a first and a second scaled differential signal pair from the first and the second variable gain amplifier circuits respectively, and outputs a modified differential signal pair in response;
wherein a phase of the modified differential signal pair is a function of the first scale factor, and
wherein the summation circuit sums a first end of the first scaled differential signal pair to a first end of the second scaled differential signal pair, and
wherein the summation circuit sums a second end of the first scaled differential signal pair to a second end of the second scaled differential signal pair.

2. The circuit of claim 1, wherein the phase of the first differential signal pair is the same as a phase of the input differential signal pair.

3. The circuit of claim 1, wherein the first differential signal pair is the input differential signal pair.

4. The circuit of claim 1, wherein the first scale factor is different than the second scale factor.

5. The circuit of claim 4, wherein the phase of the modified differential signal pair is a function of the first and the second scale factors.

6. The circuit of claim 1, wherein the first variable gain amplifier circuit comprises a limiter stage, wherein the limiter stage limits the amplitude of the first scaled differential signal pair.

7. A device comprising:
a mechanical resonator; and
a variable phase amplifier circuit coupled to the mechanical resonator, wherein the variable phase amplifier circuit receives an input differential signal pair from the mechanical resonator, and wherein the variable phase amplifier circuit comprises:
  a phase splitter circuit, wherein the phase splitter circuit generates a first and a second differential signal pair in response to receiving the input differential signal pair;
  a first variable gain amplifier circuit, wherein the first variable gain amplifier circuit scales the first differential signal pair by a first scale factor in response to receiving the first differential signal pair from the phase splitter circuit;
  a second variable gain amplifier circuit, wherein the second variable gain amplifier circuit scales the second differential signal pair by a second scale factor in response to receiving the second differential signal pair from the phase splitter circuit; and
  a summation circuit, wherein the summation circuit generates a modified differential signal pair in response to receiving a first scaled differential signal pair from the first variable gain amplifier circuit and a second scaled differential signal pair from the second variable gain amplifier circuit;
wherein the mechanical resonator receives the modified differential signal pair from the variable phase amplifier, and wherein the oscillating frequency of the mechanical resonator is a function of the phase of the modified differential signal pair.

8. The circuit of claim 7, wherein the oscillating frequency of the mechanical resonator is adjusted in response to adjusting the first scale factor.

9. The circuit of claim 7, wherein the phase of the modified differential signal pair is adjusted in response to adjusting the first scale factor.

10. The circuit of claim 9, wherein the summation circuit sums a first end of the first scaled differential signal pair to a first end of the second scaled differential signal pair.

11. The circuit of claim 10, wherein the summation circuit sums a second end of the first scaled differential signal pair to a second end of the second scaled differential signal pair.

12. The circuit of claim 11, wherein a phase of the second differential signal pair is different than a phase of the first differential signal pair.

13. The circuit of claim 12, wherein a phase of a second end of the first differential signal pair is shifted 180 degrees with respect to a phase of a first end of the first differential signal pair.

14. The circuit of claim 13, wherein a phase of a first end of the second differential signal pair is shifted 90 degrees with respect to a phase of the first end of the first differential signal pair.

15. A method of adjusting a phase of a differential signal pair comprising:
generating a second differential signal pair from a first differential signal pair, wherein:
  a phase of the second differential signal pair is shifted 90 degrees with respect to a phase of the first differential signal pair;
  a phase of a second end of the first differential signal pair is shifted 180 degrees with respect to a phase of a first end of the first differential signal pair; and
  a phase of a second end of the second differential signal pair is shifted 180 degrees with respect to a phase of a first end of the second differential signal pair;
generating a first scaled differential signal pair, wherein generating a first scaled differential signal pair comprises scaling the first differential signal pair by a first scale factor;

generating a second scaled differential signal pair, wherein generating a second scaled differential signal pair comprises scaling the second differential signal pair by a second scale factor;

generating a modified differential signal pair, wherein generating a modified differential signal pair comprises summing the first and the second scaled differential signal pairs;

adjusting the second scale factor, wherein a phase of the modified differential signal pair is adjusted in response to adjusting the second scale factor;

adjusting the first scale factor, wherein the phase of the modified differential signal pair is adjusted in response to adjusting the first scale factor; and limiting the amplitude of the first and the second differential signal pair.

16. The method of claim 15, wherein generating a second differential signal pair from a first differential signal pair comprises phase splitting the second differential signal pair from the first differential signal pair.

17. The method of claim 15, wherein generating a modified differential signal pair comprises:

summing together a first end of the first scaled differential signal pair and a first end of the second scaled differential signal pair; and summing together a second end of the first scaled differential signal pair and a second end of the second scaled differential signal pair.

18. A method of adjusting the frequency of oscillation of a mechanical resonator comprising:

generating a first and a second differential signal pair in response to receiving an input differential signal pair from a mechanical resonator;

generating a first scaled differential signal pair, wherein generating a first scaled differential signal pair comprises scaling the first differential signal pair by a first scale factor;

generating a second scaled differential signal pair, wherein generating a second scaled differential signal pair comprises scaling the second differential signal pair by a second scale factor;

summing a first end of the first scaled differential signal pair and a first end of the second scaled differential signal pair together to create a first end of a summed differential signal pair;

summing a second end of the first scaled differential signal pair and a second end of the second scaled differential signal pair together to create a second end of the summed differential signal pair;

generating a modified differential signal pair, wherein generating a modified differential signal pair comprises phase shifting the first end and the second end of the summed differential signal pair by a fixed number of degrees, and wherein a phase of the modified differential signal pair is a different value than a phase of the input differential signal pair; and providing the modified differential signal pair as input to the mechanical resonator, wherein the frequency of oscillation of the mechanical resonator is a function of the phase of the modified differential signal pair.

19. The method of claim 18, further comprising adjusting the first scale factor, wherein the frequency of oscillation of the mechanical resonator is adjusted in response to adjusting the first scale factor.

20. The method of claim 19, further comprising adjusting the second scale factor, wherein the frequency of oscillation of the mechanical resonator is adjusted in response to adjusting the second scale factor.

21. The method of claim 18, wherein the phase of the first differential signal pair is shifted 90 degrees from the phase of the second differential signal pair.

22. The method of claim 21, wherein a phase of the second end of the first differential signal pair is shifted 180 degrees from a phase of the first end of the first differential signal pair.

* * * * *